United States Patent
Ummethala et al.

(10) Patent No.: US 12,283,503 B2
(45) Date of Patent: Apr. 22, 2025

(54) SUBSTRATE MEASUREMENT SUBSYSTEM

(71) Applicant: APPLIED MATERIALS, INC., Santa Clara, CA (US)

(72) Inventors: Upendra V. Ummethala, Cupertino, CA (US); Blake Erickson, Gilroy, CA (US); Prashanth Kumar, Union City, CA (US); Michael Kutney, Santa Clara, CA (US); Steven Trey Tindel, Austin, TX (US); Zhaozhao Zhu, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 375 days.

(21) Appl. No.: 17/379,677

(22) Filed: Jul. 19, 2021

(65) Prior Publication Data

US 2022/0028716 A1 Jan. 27, 2022

Related U.S. Application Data

(60) Provisional application No. 63/055,242, filed on Jul. 22, 2020.

(51) Int. Cl.
*G01N 27/07* (2006.01)
*G01B 11/00* (2006.01)
(Continued)

(52) U.S. Cl.
CPC ...... *H01L 21/67276* (2013.01); *G01B 11/002* (2013.01); *G01N 21/9505* (2013.01);
(Continued)

(58) Field of Classification Search
CPC .......... G01N 21/9501; G01N 21/9503; G01N 21/9505
See application file for complete search history.

(56) References Cited

U.S. PATENT DOCUMENTS 5,238,354 A    8/1993   Volovich
5,427,878 A    6/1995   Corliss
(Continued)

FOREIGN PATENT DOCUMENTS

CN    305860013    6/2020
CN    306604020    6/2021
(Continued)

OTHER PUBLICATIONS

Ronald L. Allen et al.,"Application of neural networks to plasma etch end point detection", Journal of Vacuum Science & Technology B: Microelectronics and Nanometer Structures Processing, Measurement, and Phenomena 14, 498 (1996), pp. 498-503.
(Continued)

*Primary Examiner* — Herbert K Roberts
(74) *Attorney, Agent, or Firm* — Lowenstein Sandler LLP

(57) ABSTRACT

A method for a substrate measurement subsystem is provided. An indication is received that a substrate being processed at a manufacturing system has been loaded into a substrate measurement subsystem. First positional data of the substrate within the substrate measurement subsystem is determined. One or more portions of the substrate to be measured by one or more sensing components of the substrate measurement subsystem are determined based on the first positional data of the substrate and a process recipe for the substrate. Measurements of each of the determined portions of the substrate are obtained by one or more sensing components of the substrate measurement subsystem. The obtained measurements of each of the determined portions of the substrate are transmitted to a system controller.

20 Claims, 11 Drawing Sheets

(51) Int. Cl.
*G01N 21/95* (2006.01)
*H01L 21/66* (2006.01)
*H01L 21/67* (2006.01)
*G01N 21/27* (2006.01)

(52) U.S. Cl.
CPC .. *H01L 21/67259* (2013.01); *H01L 21/67294* (2013.01); *G01N 21/27* (2013.01)

(56) References Cited

U.S. PATENT DOCUMENTS

| | | | |
|---|---|---|---|
| 5,452,521 | A | 9/1995 | Niewmierzycki |
| 6,162,008 | A | 12/2000 | Perkins et al. |
| 6,304,999 | B1 | 10/2001 | Toprac et al. |
| 6,342,705 | B1 | 1/2002 | Li et al. |
| 6,625,497 | B2 | 9/2003 | Fairbairn et al. |
| 6,708,075 | B2 | 3/2004 | Sonderman et al. |
| 7,012,684 | B1* | 3/2006 | Hunter ............... H01L 21/67253 250/559.44 |
| 7,065,239 | B2* | 6/2006 | Maayah ............... G06T 7/0004 250/559.22 |
| D605,652 | S | 12/2009 | Plaisted et al. |
| 7,642,102 | B2 | 1/2010 | Funk et al. |
| D618,695 | S | 6/2010 | Bennett et al. |
| 7,904,275 | B2 | 3/2011 | Sugimoto |
| 8,072,578 | B2 | 12/2011 | Yasuda et al. |
| 8,179,530 | B2 | 5/2012 | Levy et al. |
| 8,257,546 | B2 | 9/2012 | Davis et al. |
| D756,371 | S | 5/2016 | Bertnick et al. |
| 9,347,879 | B2 | 5/2016 | Adel et al. |
| D766,940 | S | 9/2016 | Napper et al. |
| D767,612 | S | 9/2016 | Hemsley |
| D781,300 | S | 3/2017 | Rhodes et al. |
| D819,066 | S | 5/2018 | Anderson et al. |
| D829,749 | S | 10/2018 | Kang et al. |
| 10,132,757 | B2 | 11/2018 | Okuno et al. |
| 10,262,910 | B2 | 4/2019 | Feng et al. |
| 10,388,549 | B2 | 8/2019 | Paul et al. |
| 10,490,462 | B2 | 11/2019 | Pandev et al. |
| D874,481 | S | 2/2020 | Kumar et al. |
| D884,015 | S | 5/2020 | Walfridsson et al. |
| D890,799 | S | 7/2020 | Heffernan et al. |
| 10,727,057 | B2 | 7/2020 | Clark et al. |
| 10,727,142 | B2 | 7/2020 | Gellineau et al. |
| D892,143 | S | 8/2020 | Dascola et al. |
| 10,886,155 | B2 | 1/2021 | Zhu et al. |
| D914,703 | S | 3/2021 | Capela et al. |
| 11,029,673 | B2 | 6/2021 | Honda et al. |
| D928,818 | S | 8/2021 | Yuk et al. |
| D937,861 | S | 12/2021 | Torrance |
| D938,465 | S | 12/2021 | Shen et al. |
| D940,169 | S | 1/2022 | Boutros |
| D941,851 | S | 1/2022 | Anderson et al. |
| D948,543 | S | 4/2022 | Friedland et al. |
| D960,913 | S | 8/2022 | Kiikkala et al. |
| D961,605 | S | 8/2022 | Starr et al. |
| 2002/0018217 | A1 | 2/2002 | Weber-Grabau et al. |
| 2003/0020889 | A1 | 1/2003 | Takahashi |
| 2005/0041255 | A1* | 2/2005 | Hyun ............... G01B 11/0641 356/504 |
| 2005/0187649 | A1 | 8/2005 | Funk et al. |
| 2007/0134829 | A1 | 6/2007 | Wilke et al. |
| 2008/0013089 | A1 | 1/2008 | Ishii et al. |
| 2009/0132078 | A1 | 5/2009 | Sakano |
| 2010/0312374 | A1 | 12/2010 | Tsai et al. |
| 2010/0332011 | A1 | 12/2010 | Venugopal et al. |
| 2011/0172952 | A1 | 7/2011 | Ummethala et al. |
| 2011/0232569 | A1 | 9/2011 | Olgado |
| 2012/0185813 | A1 | 7/2012 | Kaushal et al. |
| 2012/0285621 | A1 | 11/2012 | Tan |
| 2013/0059403 | A1 | 3/2013 | Lee et al. |
| 2013/0242300 | A1 | 9/2013 | Sappey |
| 2015/0004721 | A1 | 1/2015 | Akimoto et al. |
| 2016/0077025 | A1 | 3/2016 | Zhang et al. |
| 2016/0313658 | A1 | 10/2016 | Bringoltz et al. |
| 2016/0341544 | A1 | 11/2016 | Foad |
| 2017/0024509 | A1 | 1/2017 | Hu et al. |
| 2017/0038201 | A1* | 2/2017 | Bozdog ............... G01N 23/2273 |
| 2017/0109646 | A1 | 4/2017 | David |
| 2017/0160648 | A1 | 6/2017 | Tel et al. |
| 2017/0213750 | A1 | 7/2017 | Khaja et al. |
| 2018/0150052 | A1 | 5/2018 | Cherian |
| 2019/0064751 | A1 | 2/2019 | Ohmori et al. |
| 2019/0121928 | A1 | 4/2019 | Wu et al. |
| 2019/0147127 | A1 | 5/2019 | Su et al. |
| 2019/0286075 | A1 | 9/2019 | Yennie et al. |
| 2019/0295874 | A1* | 9/2019 | Bieli ............... G01N 21/211 |
| 2019/0347527 | A1 | 11/2019 | Bhaviripudi et al. |
| 2019/0378012 | A1 | 12/2019 | Tripodi et al. |
| 2020/0019067 | A1* | 1/2020 | Kou ............... G03F 7/70525 |
| 2020/0050180 | A1 | 2/2020 | Kou et al. |
| 2020/0083070 | A1 | 3/2020 | Clark et al. |
| 2020/0083080 | A1 | 3/2020 | Clark et al. |
| 2020/0110341 | A1 | 4/2020 | Mossavat et al. |
| 2020/0110390 | A1 | 4/2020 | Banna |
| 2020/0243359 | A1 | 7/2020 | Hao et al. |
| 2020/0249576 | A1 | 8/2020 | Warnaar et al. |
| 2020/0264335 | A1 | 8/2020 | Bhatia et al. |
| 2020/0335406 | A1 | 10/2020 | Liman et al. |
| 2021/0035833 | A1 | 2/2021 | Feng et al. |
| 2021/0166121 | A1 | 6/2021 | Tsutsui |
| 2022/0026817 | A1 | 1/2022 | Ummethala et al. |
| 2022/0028052 | A1 | 1/2022 | Li et al. |
| 2022/0028716 | A1 | 1/2022 | Ummethala et al. |
| 2022/0066411 | A1 | 3/2022 | Ummethala et al. |
| 2022/0111529 | A1 | 4/2022 | Pehlivan et al. |
| 2022/0165593 | A1 | 5/2022 | Panda et al. |
| 2022/0246457 | A1 | 8/2022 | Sundar et al. |
| 2022/0318987 | A1 | 10/2022 | Ophir et al. |

FOREIGN PATENT DOCUMENTS

| | | |
|---|---|---|
| JP | H11186204 A | 7/1999 |
| JP | 2001110806 A | 4/2001 |
| JP | 2020-004817 A | 1/2002 |
| JP | 2004165365 A | 6/2004 |
| JP | 2004529485 A | 9/2004 |
| JP | 2009-534854 A | 9/2009 |
| JP | 2009295700 A | 12/2009 |
| JP | 4467761 B2 | 5/2010 |
| JP | 6270952 B1 | 1/2018 |
| JP | 2018037559 A | 3/2018 |
| JP | 2018-524821 A | 8/2018 |
| JP | 2018522393 A | 8/2018 |
| JP | D1644619 S | 8/2019 |
| JP | D1651220 S | 1/2020 |
| JP | D1659894 S | 5/2020 |
| JP | 2020517093 A | 6/2020 |
| JP | D1664109 S | 7/2020 |
| KR | 101910268 B1 | 10/2018 |
| KR | 20190071016 A | 6/2019 |
| TW | 201928285 A | 7/2019 |
| WO | 9945340 A1 | 9/1999 |
| WO | 0229393 A1 | 4/2002 |
| WO | 2007124294 A2 | 11/2007 |
| WO | 2012099907 A1 | 7/2012 |
| WO | 2016182965 A1 | 11/2016 |
| WO | 2018067885 A1 | 4/2018 |
| WO | 2019200015 A1 | 10/2019 |
| WO | 2019239380 A1 | 12/2019 |
| WO | 020094325 A1 | 5/2020 |
| WO | 2021021501 A1 | 2/2021 |
| WO | 2021061541 A1 | 4/2021 |
| WO | 2021067239 A1 | 4/2021 |

OTHER PUBLICATIONS

PCT International Search Report and Written Opinion for International Application No. PCT/US2021/042646 mailed Nov. 2, 2021, 10 pages.

PCT International Search Report and Written Opinion for International Application No. PCT/US2021/042639 mailed Nov. 11, 2021, 10 pages.

(56) References Cited

OTHER PUBLICATIONS

PCT International Search Report and Written Opinion for International Application No. PCT/US2021/042643 mailed Nov. 11, 2021, 9 pages.
Zalusky, Sarah et al. "Developing a Non-destructive Manufacturing Test to Detect Crystal Defects in Semiconductor Wafers" Apr. 8, 2020, JKI, site visited Sep. 2, 2022: https://www.jki.net/femtometrix-case-study (Year: 2020).
"Production-centric Yield Management for Wafer Manufacturing" Jan. 5, 2018, Synopisis, site visited Jan. 6, 2022: https://www.synopsys.com/content/dam/synopsys/silicon/datasheets/odyssey-ds.pdf (Year: 2018).
PCT International Search Report and Written Opinion for International Application No. PCT/US2021/048061 mailed Dec. 17, 2021, 9 pages.
Taiwan Search report of Taiwan Application No. 110300382 dated Sep. 27, 2021.
PCT International Search Report and Written Opinion for International Application No. PCT/US2023/076657 mailed Feb. 6, 2024, 9 pages.
Kang P., et al., "Virtual Metrology for Run-to-run Control in Semiconductor Manufacturing," Expert Systems with Applications, Mar. 2011, vol. 38(3), pp. 2508-2522.
Extended European Search Report for European Application No. 21845417.1, mailed Oct. 9, 2024, 08 Pages.

\* cited by examiner

900

```
Receive an indication that a substrate being processed at a manufacturing system has been
loaded into a substrate measurement sub-system 910
                                    ↓
Determine positional data of the substrate within the substrate measurement sub-system
                                    920
                                    ↓
                        Receive a recipe for the substrate 930
                                    ↓
Determine, based on the positional data and the recipe of the substrate, one or more portions
   of the substrate to be measured by one or more sensing components of the substrate
                              measurement system 940
                                    ↓
Obtain measurements for each of the determined portions of the substrate by the one or
       more sensing components of the substrate measurement sub-system 950
                                    ↓
Transmit the obtained measurements of each of the determined portions of the substrate to
                           a system controller 960
```

FIG. 9

SUBSTRATE MEASUREMENT SUBSYSTEM

RELATED APPLICATION

This application claims benefit of U.S. Provisional Patent Application 63/055,242, filed Jul. 22, 2020, the entire content of which is incorporated by reference herein.

TECHNICAL FIELD

Embodiments of the present disclosure relate, in general, to manufacturing systems and more particularly to a substrate measurement subsystem.

BACKGROUND

Processing of a substrate at a manufacturing system generally includes multiple processing operations that are performed for the substrate in accordance with a pre-determined process recipe. In some instances, one or more conditions at the manufacturing system can change unexpectedly during the processing of the substrate. If the substrate is processed according to the pre-determined process recipe as the change in manufacturing conditions occur, errors can result during the process and a finished substrate can be defective. In some instances, an operation of the process recipe can be modified in view of the changed condition in order to prevent the error from occurring during the processing of the substrate. However, it can be difficult for an operator of the manufacturing system to identify which operation of the process recipe should be modified.

SUMMARY

Some of the embodiments described cover a method including receiving an indication that a substrate being processed at a manufacturing system has been loaded into a substrate measurement subsystem. The method further includes determining first positional data of the substrate within the substrate measurement subsystem. The method further includes determining, based on the first positional data of the substrate and a process recipe for the substrate, one or more portions of the substrate to be measured by one or more sensing components of the substrate measurement subsystem. The method further includes obtaining measurements of each of the determined portions of the substrate by one or more sensing components of the substrate measurement subsystem. The method further includes transmitting the obtained measurements of each of the determined portions of the substrate to a system controller.

In some embodiments, a manufacturing system includes one or more sensing components configured to obtain measurements for one or more portions of a substrate within the substrate measurement subsystem, and a controller coupled to the one or more sensing components. The controller is to receive an indication that a substrate being processed at a manufacturing system has been loaded into the substrate measurement subsystem. The controller is further to determine first positional data of the substrate within the substrate measurement subsystem. The controller is further to determine, based on the first positional data of the substrate and a process recipe for the substrate, one or more portions of the substrate to be measured by one or more sensing components of the substrate measurement subsystem. The controller is further to transmit the obtained measurements of each of the determined portions of the substrate to a system controller.

In some embodiments, a non-transitory computer readable storage medium includes instructions that, when executed by a processing device, cause the processing device to receive an indication that a substrate being processed at a manufacturing system has been loaded into a substrate measurement subsystem. The instructions further cause the processing device to determine first positional data of the substrate within the substrate measurement subsystem. The instructions further cause the processing device to determine, based on the first positional data of the substrate and a process recipe for the substrate, one or more portions of the substrate to be measured by one or more sensing components of the substrate measurement subsystem. The instructions further cause the processing device to obtain measurements of each of the determined portions of the substrate by one or more sensing components of the substrate measurement subsystem. The instructions further cause the processing device to transmit the obtained measurements of each of the determined portions of the substrate to a system controller.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 9 is a flow chart of a method for obtaining spectral data for a substrate at a substrate measurement subsystem, according to aspects of the present disclosure.

DETAILED DESCRIPTION OF EMBODIMENTS

Figure 1:
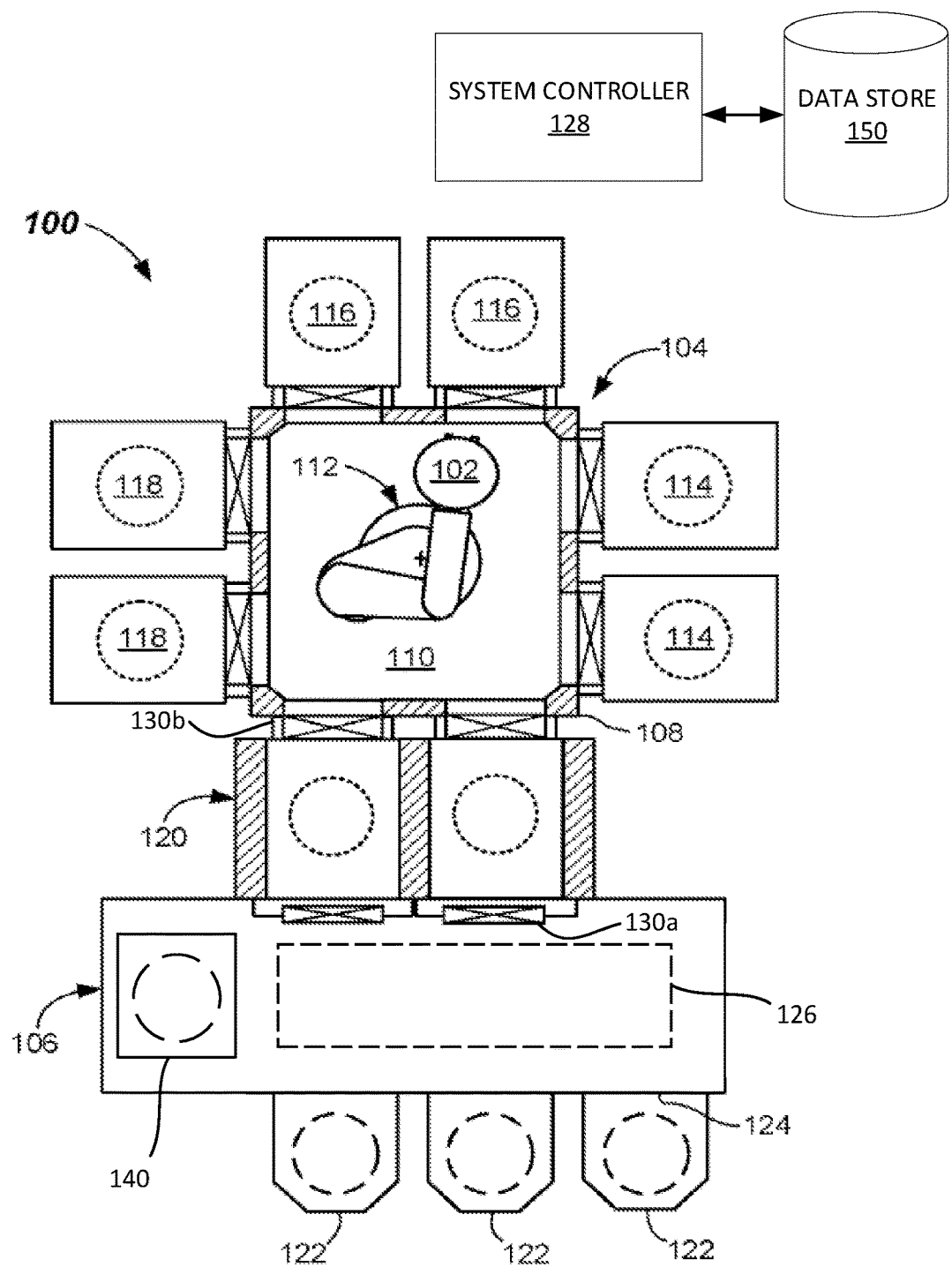
FIG. 1 is a top schematic view of an example manufacturing system, according to aspects of the present disclosure.

Implementations described herein provide an integrated substrate measurement system to improve manufacturing process performance. Various components of the integrated substrate measurement system can be operatively coupled to a system controller configured to control a process for a substrate at a manufacturing system. The system controller can be configured to receive data from various portions of a manufacturing system and store data at a data store dedicated to store data collected at the integrated substrate measurement system. The system controller can receive data from one or more portions of the manufacturing system (e.g., a processing chamber, a load lock, etc.) before, during, or after processing of a substrate. The system controller can also receive data from a substrate measurement subsystem included within the integrated substrate measurement system. The substrate measurement subsystem may be integrated within one or more portions of the manufacturing system (e.g., at a factory interface). The substrate measurement subsystem may be configured to generate data associated with substrate before or after processing of the substrate at another portion of the system.

The substrate measurement subsystem may be configured to generate one or more types of data for the substrate, including spectral data, positional data, substrate property data, etc. The substrate measurement subsystem can generate the data for the substrate in response to a request to obtain one or more measurements for the substrate before or after the substrate is processed at the manufacturing system. The substrate measurement subsystem may include one or more components that facilitate the generation of data for the substrate. For example, the substrate measurement subsystem can include a spectra sensing component for sensing spectra or spectrum from a portion of the substrate and generating spectral data for the substrate. In some embodiments, the spectra sensing component can be an interchangeable component that can be configurable based on a type of process performed at the manufacturing system or a target type of measurements to be obtained at the substrate measurement subsystem. For example, one or more components of the spectra sensing component can be interchanged at the substrate measurement subsystem to enable the collection of reflectometry spectral data, ellipsometry spectral data, hyperspectral imaging data, chemical imaging (e.g., x-ray photoelectron spectroscopy (XPS), energy-dispersive x-ray spectroscopy (EDX), (x-ray fluorescence (XRF), etc.) data, and so forth. The substrate measurement subsystem can also include positional components configured to modify a position and/or orientation of the substrate within the substrate measurement subsystem. The positional components can also generate positional data associated with the substrate. The substrate measurement subsystem can correlate positional data and spectral data generated for a portion of the substrate. The substrate measurement subsystem may transmit the generated data (e.g., spectral data, positional data, etc.), to the system controller of the manufacturing system.

Responsive to the system controller receiving data from the substrate measurement subsystem and a portion of the manufacturing system, the system controller can determine whether to modify a process recipe for the substrate. The system controller can generate a mapping between a first set of data received from the substrate measurement component and a second set of data received from a portion of the manufacturing system. Responsive to generating the mapping between the first set of data and the second set of data, the system controller may determine whether to modify the process recipe for the substrate based on the mapping. In some embodiments, responsive to determining to modify the process recipe for the substrate, the system controller can transmit a notification to a user of the manufacturing system recommending that a modification should be made to the process recipe. The system controller may modify the process recipe responsive to receiving a notification from the user of the manufacturing system that the process recipe is to be modified in accordance with the recommendation. In other or similar embodiments, the system controller may modify the process recipe without providing an indication to the user of the manufacturing system.

Implementations of the present disclosure address the above noted deficiencies conventional technology by providing a system for determining whether a modification is to be made for the process recipe for a substrate. By generating measurements for the substrate before during, or after the substrate is processed at the manufacturing system, a system controller can determine if any changes have occurred within the manufacturing system that may affect the process for the substrate. Responsive to determining that a change has occurred within the manufacturing system, the system controller can determine a modification to be made to the process recipe to prevent an error from occurring during the substrate process as a result of the change to the manufacturing system. By modifying the process recipe for the substrate, the system controller decreases the likelihood that a processed substrate will be defective, therefore increasing overall throughput of the manufacturing system. Further, by integrating the substrate measurement subsystem within the manufacturing system, an overall sampling rate of each substrate within the manufacturing system increases.

FIG. 1 is a top schematic view of an example manufacturing system 100, according to aspects of the present disclosure. Manufacturing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 100 may include a process tool 104 and a factory interface 106 coupled to process tool 104. Process tool 104 may include a housing 108 having a transfer chamber 110 therein. Transfer chamber 110 may include one or more processing chambers (also referred to as process chambers) 114, 116, 118 disposed therearound and coupled thereto. Processing chambers 114, 116, 118 may be coupled to transfer chamber 110 through respective ports, such as slit valves or the like.

Processing chambers 114, 116, 118 may be adapted to carry out any number of processes on substrates 102. A same or different substrate process may take place in each processing chamber 114, 116, 118. A substrate process may include atomic layer deposition (ALD), physical vapor deposition (PVD), chemical vapor deposition (CVD), etching, annealing, curing, pre-cleaning, metal or metal oxide removal, or the like. In some embodiments, a substrate process may include a combination of two or more of atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 114, an etching process may be performed in one or both of process chambers 116, and an annealing process may be performed in one or both of process chambers 118. Other processes may be carried out on substrates therein. Processing chambers 114, 116, 118 may each include one or more sensors configured to capture data for substrate 102 and/or an environment within processing chamber 114, 116, 118, before, after, or during a substrate process. In some embodiments, the one or more sensors may be configured to capture data including a value of one or more of: spectra or spectrum (e.g., light spectra), temperature (e.g., heater temperature), spacing (SP), pressure, high frequency radio frequency (HFRF), voltage of an electrostatic chuck (ESC), electrical current, flow, power, voltage, capacitance and so forth. Further details with respect to processing chamber 114, 116, 118 are provided with respect to FIG. 3.

Transfer chamber 110 may also include a transfer chamber robot 112. Transfer chamber robot 112 may include one or multiple arms where each arm includes one or more end effectors at the end of each arm. The end effector may be configured to handle particular objects, such as wafers. Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on.

A load lock 120 may also be coupled to housing 108 and transfer chamber 110. Load lock 120 may be configured to interface with, and be coupled to, transfer chamber 110 on one side and factory interface 106. Load lock 120 may have an environmentally-controlled atmosphere that may be changed from a vacuum environment (wherein substrates may be transferred to and from transfer chamber 110) to an inert-gas environment at or near atmospheric-pressure (wherein substrates may be transferred to and from factory interface 106) in some embodiments. In some embodiments, load lock 120 may be a stacked load lock having a pair of upper interior chambers and a pair of lower interior chambers that are located at different vertical levels (e.g., one above another). In some embodiments, the pair of upper interior chambers may be configured to receive processed substrates from transfer chamber 110 for removal from process tool 104, while the pair of lower interior chambers may be configured to receive substrates from factory interface 106 for processing in process tool 104. In some embodiments, load lock 120 may be configured to perform a substrate process (e.g., an etch or a pre-clean) on one or more substrates 102 received therein.

Factory interface 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers (also referred to as containers) 122 and load lock 120. In other and/or similar embodiments, factory interface 106 may be configured to receive replacement parts from replacement parts storage containers 123. Factory interface robot 126 may include one or more robot arms and may be or include a SCARA robot. In some embodiments, factory interface robot 126 may have more links and/or more degrees of freedom than transfer chamber robot 112. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, transfer chamber 110, process chambers 114, 116, and 118, and load lock 120 may be maintained at a vacuum level. Manufacturing system 100 may include one or more vacuum ports that are coupled to one or more stations of manufacturing system 100. For example, first vacuum ports 130a may couple factory interface 106 to load locks 120. Second vacuum ports 130b may be coupled to load locks 120 and disposed between load locks 120 and transfer chamber 110. In other or similar embodiments, transfer chamber 110, process chambers 114, 116, and 118, and/or load lock 120 may not be maintained at a vacuum level.

Manufacturing system 100 may also be connected to a client device (not shown) that is configured to provide information regarding manufacturing system 100 to a user (e.g., an operator). A client device may include a computing device such as a personal computer (PC), laptop, mobile phone, smart phone, tablet computer, netbook computer, network-connected television, etc. In some embodiments, the client device may provide information to a user of manufacturing system 100 via one or more graphical user interfaces (GUIs). For example, the client device may provide information regarding one or more modifications to be made to a process recipe for a substrate 102 via a GUI.

Manufacturing system 100 may also include a system controller 128. System controller 128 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 128 may include a data storage device (e.g., one or more disk drives and/or solid state drives), a main memory, a static memory, a network interface, and/or other components. System controller 128 may execute instructions to perform any one or more of the methodologies and/or embodiments described herein. In some embodiments, system controller 128 may execute instructions to perform one or more operations at manufacturing system 100 in accordance with a process recipe. A process recipe include a series of operations to be performed at the manufacturing system 100 in a specific order. The instructions may be stored on a computer readable storage medium, which may include the main memory, static memory, secondary storage and/or processing device (during execution of the instructions).

System controller 128 may receive data from sensors included on or within various portions of manufacturing system 100 (e.g., processing chambers 114, 116, 118, transfer chamber 110, load lock 120, etc.). Data received by the system controller 128 may include data associated with substrate 102 and/or an environment surrounding substrate 102 within a portion of manufacturing system 100. For purposes of the present description, system controller 128 is described as receiving data from sensors included within processing chambers 114, 116, 118. However, system controller 128 may receive data from any portion of manufacturing system 100 and may use data received from the portion in accordance with embodiments described herein. In an illustrative example, system controller 128 may receive data from one or more sensors for processing chamber 114, 116, 118 before, after, or during a substrate process at the processing chamber 114, 116, 118. In such example, the data received from processing chamber 114, 116, 118 may be associated with substrate 102, including temperature data, a positional data (e.g., a position and/or an orientation of the substrate 102 within processing chamber 114, 116, 118), and so forth. Data received by system controller 128 may also be associated with an environment of processing chamber 114, 116, 118, including data indicating a temperature or internal pressure of processing chamber 114, 116, 118, an amount of radiation within the processing chamber 114, 116, 118, and so forth. Data received from sensors of the various portions of manufacturing system 100 may be stored in a data store 150. Data store 150 may be included as a component within system controller 128 or may be a separate component from system controller 128. Further details regarding data store 150 are provided with respect to FIG. 4.

Manufacturing system 100 may include a substrate measurement subsystem 140. Substrate measurement subsystem 140 may obtain measurements for one or more portions of a substrate 102 before or after the substrate 102 is processed at manufacturing system 100. In some embodiments, substrate measurement subsystem 140 may obtain measurements for one or more portions of substrate 102 in response to receiving a request for the measurements from system controller 128. Substrate measurement subsystem 140 may be integrated within a portion of manufacturing system 100. In some embodiments, substrate measurement subsystem 140 may be integrated within factory interface 106. In such embodiments, factory interface robot 126 may be configured to transfer substrates 102 between substrate carriers 122 and substrate measurement subsystem 140 and/or substrate measurement subsystem 140 and load lock 120. In other or similar embodiments, substrate measurement subsystem 140 may not be integrated with any portion of manufacturing system 100 and instead may be a stand-alone component. In such embodiments, a substrate 102 measured at substrate measurement subsystem 140 may be transferred to and from a portion of manufacturing system 100 prior to or after the substrate 102 is processed at manufacturing system 100.

Substrate measurement subsystem 140 may obtain measurements for a portion of substrate 102 by generating data associated with the portion of substrate 102. In some embodiments, substrate measurement subsystem 140 is configured to generate spectral data, positional data, and other substrate property data for substrate 102. In some embodiments, substrate measurement subsystem 140 may include one or more reflectometry sensors (i.e., reflectometer). In such embodiments, spectral data generated by substrate measurement subsystem 140 may refer to a reflected optical intensity of each wavelength of a wave reflected from a portion of substrate 102. In other or similar embodiments, substrate measurement subsystem 140 may include one or more ellipsometry sensors (i.e., ellipsometer). In such embodiments, spectral data generated by substrate measurement subsystem 140 may refer to a reflected optical intensity of a wavelength of a polarized light wave reflected from a portion of substrate 102. In other or similar embodiments, spectral data may refer to spectral data collected from, thermal spectra sensors, and so forth. As mentioned above, substrate measurement subsystem 140 can generate other substrate property data for substrate 102 (i.e., non-spectral data). For example, substrate measurement subsystem 140 can generate data based on signals collected from eddy current (i.e., inductive) sensors, capacitive sensors, and so forth.

After generating data for substrate 102, substrate measurement subsystem 140 may transmit the generated data to system controller 128. Responsive to receiving data from substrate measurement subsystem 140, system controller 128 may store the data at data store 150.

In some embodiments, data received by the system controller 128 from substrate measurement subsystem 140 may be associated with data received from one or more sensors of processing chamber 114, 116, 118. For example, a first set of data for substrate 102 may be generated at substrate measurement system 140. In response system controller 128 receiving the first set of data, substrate 102 may be transferred to processing chamber 114, 116, 118 for processing. At processing chamber 114, 116, 118, a second set of data may be generated for substrate 102 and transferred to system controller 128. Responsive to determining the first set of data is associated with the second set of data, system controller 128 may generate a mapping between the first set of data and the second set of data and store the generated mapping to data store 150. Based on the mapping between the first set of data and the second set of data, the system controller 128 may determine whether to modify the process recipe for the substrate 102. Further details regarding system controller 128 determining whether to modify the process recipe for substrate 102 are provided with respect to FIG. 4.

In some embodiments, responsive to determining to modify the process recipe, system controller 128 may provide a notification to an operator of manufacturing system 100 indicating the process recipe should be modified. In some examples, the notification may be provided via a GUI displayed via the client device, such as GUI 500 of FIG. 5. The notification may provide a recommendation to modify one or more operations of the process recipe along with a GUI element that enables the operator to accept or reject the modification to the process recipe. In other or similar embodiments, the notification may provide multiple alternative recommendations for modifications to one or more operations of the process recipe along with one or more GUI elements that enable the operator to select a recommendation over other alternative recommendations. In some embodiments, system controller 128 may not provide a notification to the operator of the manufacturing system 100 and instead may modify the processing recipe based on an identification of the best modification to the process recipe.

Figure 2:
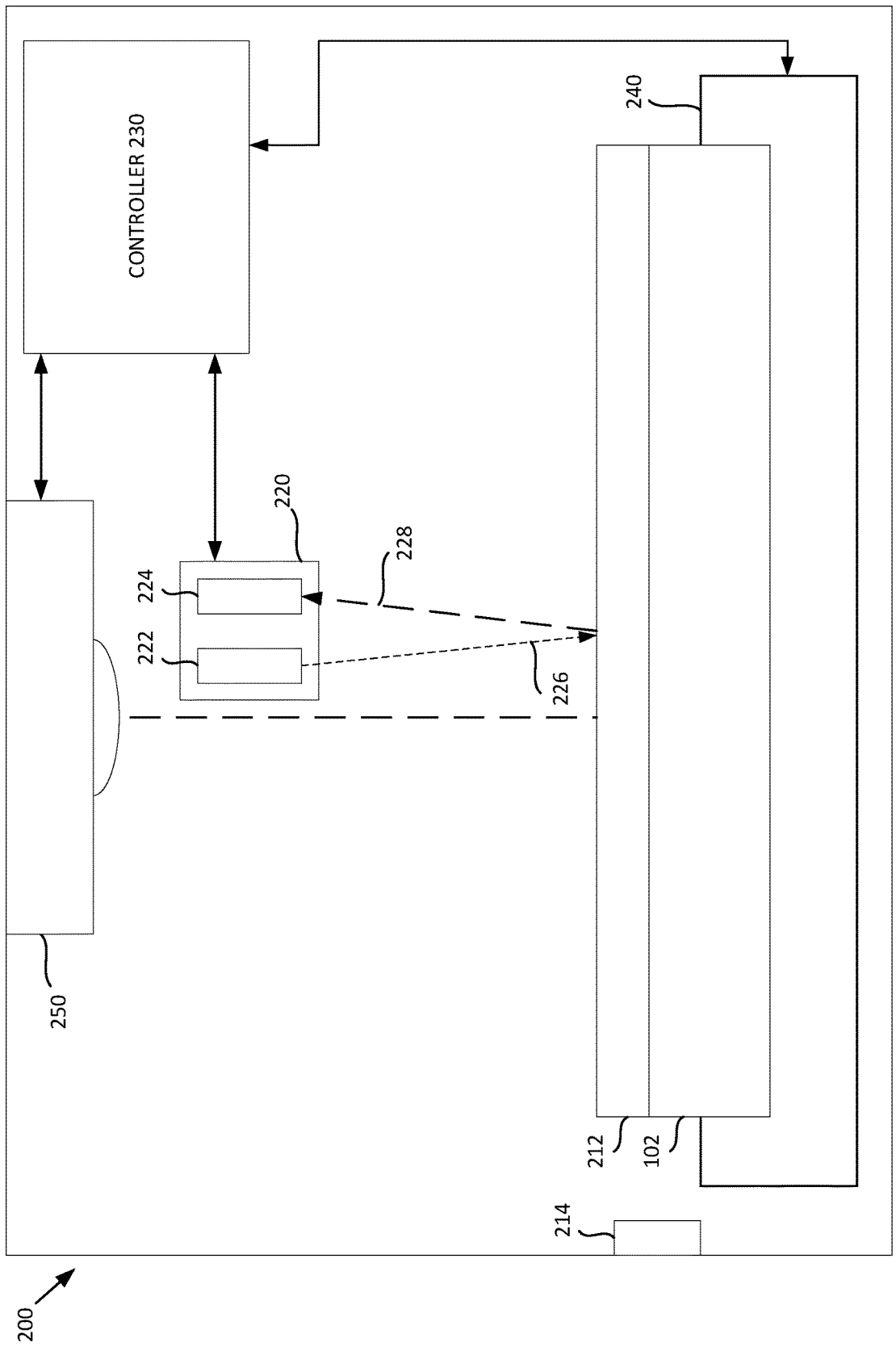
FIG. 2 is a cross-sectional schematic side view of a substrate measurement subsystem, according to aspects of the present disclosure.

FIG. 2 is a cross-sectional schematic side view of a substrate measurement subsystem 200, according to aspects of the present disclosure. Substrate measurement subsystem 200 may be configured to obtain measurements for one or more portions of a substrate, such as substrate 102 of FIG. 1, prior to or after processing of substrate 102 at a processing chamber. Substrate measurement subsystem 200 may obtain measurements for a portion of substrate 102 by generating data associated with the portion of substrate 102. In some embodiments, substrate measurement subsystem 200 may be configured to generate spectral data, positional data, and/or other property data associated with substrate 102. Substrate measurement subsystem 200 may include a controller 230 configured to execute one or more instructions for generating data associated with a portion of substrate 102.

Substrate measurement subsystem 200 may include a substrate sensing component 214 configured to detect when substrate 102 is transferred to substrate measurement subsystem 200. Substrate sensing component 214 may include any component configured to detect when substrate 102 is transferred to substrate measurement subsystem 200. For example, substrate sensing component 214 may include an optical sensing component that transmits an optical beam across an entrance to substrate measurement subsystem 200. Substrate sensing component 214 may detect that a substrate 102 has been transferred to substrate measurement subsystem 200 responsive to substrate 102 breaking the optical beam transmitted across the entrance to substrate measurement subsystem 200 as substrate 102 is placed within substrate measurement subsystem 200. Responsive to detecting that substrate 102 has been transferred to substrate measurement subsystem 200, substrate sensing component 214 may transmit an indication to controller 230 indicating that substrate 102 has been transferred to substrate measurement subsystem 200.

In some embodiments, substrate sensing component 214 may be further configured to detect identifying information associated with substrate 102. In some embodiments, substrate 102 may be embedded within a substrate carrier (not shown) when transferred to substrate measurement subsystem 200. The substrate carrier may include one or more registration features that enable identification of substrate 102. For example, an optical sensing component of substrate sensing component 214 may detect that substrate 102, embedded within the substrate carrier, has broken the optical beam transmitted across the entrance to substrate measurement subsystem 200. The optical sensing component may further detect one or more registration features included on the substrate carrier. Responsive to detecting the one or more registration features, the optical sensing component may generate an optical signature associated with the one or more registration features. Substrate sensing component 214 may transmit the optical signature generated by the optical sensing component to controller 230 along with the indication that the substrate has been placed within substrate measurement subsystem 200. Responsive to receiving the optical signature from sensing component 214, controller 230 may analyze the optical signature to determine the identifying information associated with substrate 102. The identifying information associated with substrate 102 may include an identifier for substrate 102, an identifier for a process for substrate 102 (e.g., a batch number or a process run number), an identifier of a type for substrate 102 (e.g., a wafer, etc.), and so forth.

Substrate measurement subsystem 200 may include one or more components configured to determine a position and/or an orientation of substrate 102 within substrate measurement subsystem 200. The position and/or orientation of substrate 102 may be determined based on an identification of a reference location of substrate 102. A reference location may be a portion of substrate 102 that includes an identifying feature that is associated with a specific portion of substrate 102. For example, substrate 102 may have a reference tag embedded in a center portion of substrate 102. In another example, substrate 102 may have one or more structural features included on the surface of the substrate 102 at a center portion of substrate 102. Controller 230 may determine an identifying feature associated with a specific portion of substrate 102 based on determined identifying information for substrate 102. For example, responsive to determining that substrate 102 is a wafer, controller 230 may determine one or more identifying features that are generally included at a portion of a wafer.

Controller 230 may identify the reference location for substrate 102 using one or more camera components 250 configured to capture image data for substrate 102. Camera components 250 may generate image data for with one or more portions of the substrate 102 and transmit the image data to controller 230. Controller 230 may analyze the image data to identify an identifying feature associated with a reference location for substrate 102. Controller 230 may further determine a position and/or orientation of substrate 102 as depicted in the image data based on the identified identifying feature of substrate 102. Controller 230 may determine a position and/or orientation of substrate 102 based on the identified identifying feature of substrate 102 and the determined position and/or orientation of substrate 102 as depicted in the image data.

Responsive to determining the position and/or orientation of substrate 102, controller 230 may generate positional data associated with one or more portions of substrate 102. In some embodiments, the positional data may include one or more coordinates (e.g., Cartesian coordinates, polar coordinates etc.) each associated with a portion of substrate 102, where each coordinate is determined based on a distance from the reference location for substrate 102. For example, responsive to determining the position and/or orientation of substrate 102, controller 230 may generate first positional data associated with a portion of substrate 102 that includes the reference location, where the first positional data includes a Cartesian coordinate of (0,0). Controller 230 may generate second positional data associated with a second portion of substrate 102 that is relative to the reference location. For example, a portion of substrate 102 that is located approximately 2 nanometers (nm) due east of the reference location may be assigned a Cartesian coordinate of (0, 1). In another example, a portion of substrate 102 that is located 5 nms due north of the reference location may be assigned a Cartesian coordinate of (1, 0).

Controller 230 may determine one or more portions of substrate 102 to measure based on positional data determined for substrate 102. In some embodiments, controller 230 may receive one or more operations of a process recipe associated with substrate 102. In such embodiments, controller 230 may further determine the one or more portions of substrate 102 to measure based on one or more operations of the process recipe. For example, controller 230 may receive an indication that an etch process was performed for substrate 102 where several structural features were etched onto the surface of substrate 102. As a result, controller 230 may determine one or more structural features to measure and the expected locations of the features at various portions of substrate 102.

Substrate measurement subsystem 200 may include one or more measurement components for measuring substrate 102. In some embodiments, substrate measurement subsystem 200 may include one or more spectra sensing components 220 configured to generate spectral data for one or more portions of substrate 102. As discussed previously, spectral data may correspond to an intensity (i.e., a strength or amount of energy) of a detected wave of energy for each wavelength of the detected wave. Further details regarding the collected spectral data is provided with respect to FIG. 6. The measurement components for measuring substrate 102 can also include non-spectral sensing components (not shown) configured to collect and generate non-spectral data. For example, the measurement components can include an eddy current sensor or a capacitive sensor. Although some embodiments of the present description may refer to collecting and using spectral data for substrate 102, embodiments of the present description can be applicable to non-spectral data collected for substrate 102.

A spectra sensing component 220 may be configured to detect waves of energy reflected from a portion of substrate 102 and generate spectral data associated with the detected waves. Spectra sensing component 220 may include a wave generator 222 and a reflected wave receiver 224. In some embodiments, wave generator 222 may be a light wave generator configured to generate a beam of light towards a portion of substrate 102. In such embodiments, reflected wave receiver 224 may be configured to receive a reflected light beam from the portion of substrate 102. Wave generator 222 may be configured to generate an energy stream 226 (e.g., a light beam) and transmit energy stream 226 to a portion of substrate 102. A reflected energy wave 228 may be reflected from the portion of substrate 102 and received by reflected wave receiver 224. Although FIG. 3A illustrates a single energy wave reflected off the surface of substrate 102, multiple energy waves may be reflected off the surface of substrate 102 and received by reflected wave receiver 224.

Responsive to reflected wave receiver 224 receiving reflected energy wave 228 from the portion of substrate 102, spectra sensing component 220 may measure a wavelength of each wave included in reflected energy wave 228. Spectra sensing component 220 may further measure an intensity of each measured wavelength. Responsive to measuring each wavelength and each wavelength intensity, spectra sensing component 220 may generate spectral data for the portion of substrate 102. Spectra sensing component 220 may transmit the generated spectral data to controller 230. Controller 230 may, responsive to receiving the generated spectral data, generate a mapping between the received spectral data and positional data for the measured portion of substrate 102.

Substrate measurement subsystem 200 may be configured to generate a specific type of spectral data based on a type of measurement to be obtained at substrate measurement subsystem 200. In some embodiments, spectra sensing component 220 may be a first spectra sensing component that is configured to generate one type of spectral data. For example, spectra sensing component 220 may be configured to generate reflectometry spectral data, ellipsometry spectral data, hyperspectral imaging data, chemical imaging data, thermal spectral data, or conductive spectral data. In such embodiments, the first spectra sensing component may be removed from substrate measurement subsystem 200 and replaced with a second spectra sensing component configured to generate a different type of spectral data (e.g., reflectometry spectral data, ellipsometry spectral data, hyperspectral imaging data, or chemical imaging data).

Controller 230 may determine a type of data (i.e., spectral data, non-spectral data) to be generated for substrate 102 based on a type of measurement to be obtained for one or more portions of substrate 102. In some embodiments, controller 230 may determine the one or more types of measurements based on a notification received from system controller 128. In other or similar embodiments, controller 230 may determine the one or more types of measurements based on an instruction to generate a measurement for a portion of substrate 102. Responsive to determining the one or more types of measurements to be obtained, controller 230 may determine the type of data to be generated for substrate 102. For Example, controller 230 can determine that spectral data is to be generated for substrate 102 and that the second spectra sensing component is an optimal sensing component for obtaining the determined type of measurements for the one or more portions of substrate 102. Responsive to determining the second sensing component is the optimal sensing component, controller 230 may transmit a notification to the system controller indicating that the first spectra sensing component should be replaced with the second spectra sensing component and the second spectra sensing component should be used to obtain the one or more types of measurements for the one or more portions of substrate 102. System controller 128 may transmit the notification to a client device connected to the manufacturing system where the client device may provide the notification to a user of the manufacturing system (e.g., an operator) via a GUI.

In other or similar embodiments, spectra sensing component 220 may be configured to generate multiple types of spectral data. In such embodiments, controller 230 may cause spectra sensing component 220 to generate a specific type of spectral data based on the type of measurements to be obtained for one or more portions of substrate 102, in accordance with previously described embodiments. Responsive to determining the type of measurements to be obtained, controller 230 may determine that a first type of spectral data is to be generated by spectra sensing component 220. Based on the determination that the first type of spectral data is to be generated by spectra sensing component 220, controller 230 may cause spectra sensing component 220 to generate the first type of spectral data for the one or more portions of substrate 102.

As described previously, controller 230 may determine one or more portions of substrate 102 to measure at substrate measurement subsystem 200. In some embodiments, one or more measurement components, such as spectra sensing component 220, may be stationary components within substrate measurement subsystem 200. In such embodiments, substrate measurement subsystem 200 may include one or more positional components 240 configured to modify a position and/or an orientation of substrate 102 with respect to spectra sensing component 220. In some embodiments, positional components 240 may be configured to translate substrate 102 along a first axis and or a second axis, relative to spectra sensing component 220. In other or similar embodiments, positional components 240 may be configured to rotate substrate 102 around a third axis relative to spectra sensing component 220.

As spectra sensing component 220 generates spectral data for one or more portions of substrate 102, positional components 240 may modify the position and/or orientation of substrate 102 in accordance with the one or more determined portions to be measured for substrate 102. For example, prior to spectra sensing component 220 generating spectral data for substrate 102, positional components 240 may position substrate 102 at Cartesian coordinate (0,0) and spectra sensing component 220 may generate first spectral data for substrate 102 at Cartesian coordinate (0,0). Responsive to spectra sensing component 220 generating first spectral data for substrate 102 at Cartesian coordinate (0,0), positioning components 240 may translate substrate 102 along a first axis so that spectra sensing component 220 is configured to generate second spectral data for substrate 102 at Cartesian coordinate (0,1). Responsive to spectra sensing component 220 generating second spectral data for substrate 102 at Cartesian coordinate (0,1), controller 230 may rotate substrate 102 along a second axis so that spectra sensing component 220 is configured to generate third spectral data for substrate 102 at Cartesian coordinate (1,1). This process may occur multiple times until spectral data is generated for each determined portion of substrate 102.

In some embodiments, one or more layers 212 of material may be included on a surface of substrate 102. The one or more layers 212 may include etch material, photoresist material, mask material, deposited material, etc. In some embodiments, the one or more layers 212 may include an etch material to be etched according to an etch processed performed at a processing chamber. In such embodiments, spectral data may be collected for one or more portions of the un-etched etch material of the layer 212 deposited on substrate 102, in accordance with previously disclosed embodiments. In other or similar embodiments, the one or more layers 212 may include an etch material that has already been etched according an etch process at the processing chamber. In such embodiments, one or more structural features (e.g., lines, columns, openings, etc.) may be etched into the one or more layers 212 of substrate 102. In such embodiments, spectral data may be collected for one or more structural features etched into the one or more layers 212 of substrate 102.

In some embodiments, substrate measurement subsystem 200 may include one or more additional sensors configured to capture additional data for substrate 102. For example, substrate measurement subsystem 200 may include additional sensors configured to determine a thickness of substrate 102, a thickness of a film deposited on the surface of substrate 102, etc. Each sensor may be configured to transmit captured data to controller 230.

Responsive to receiving at least one of the spectral data, the positional data, or the property data for the substrate 102, controller 230 may transmit the received data to system controller 128 for processing and analysis, in accordance with embodiment described herein.

Figure 3:
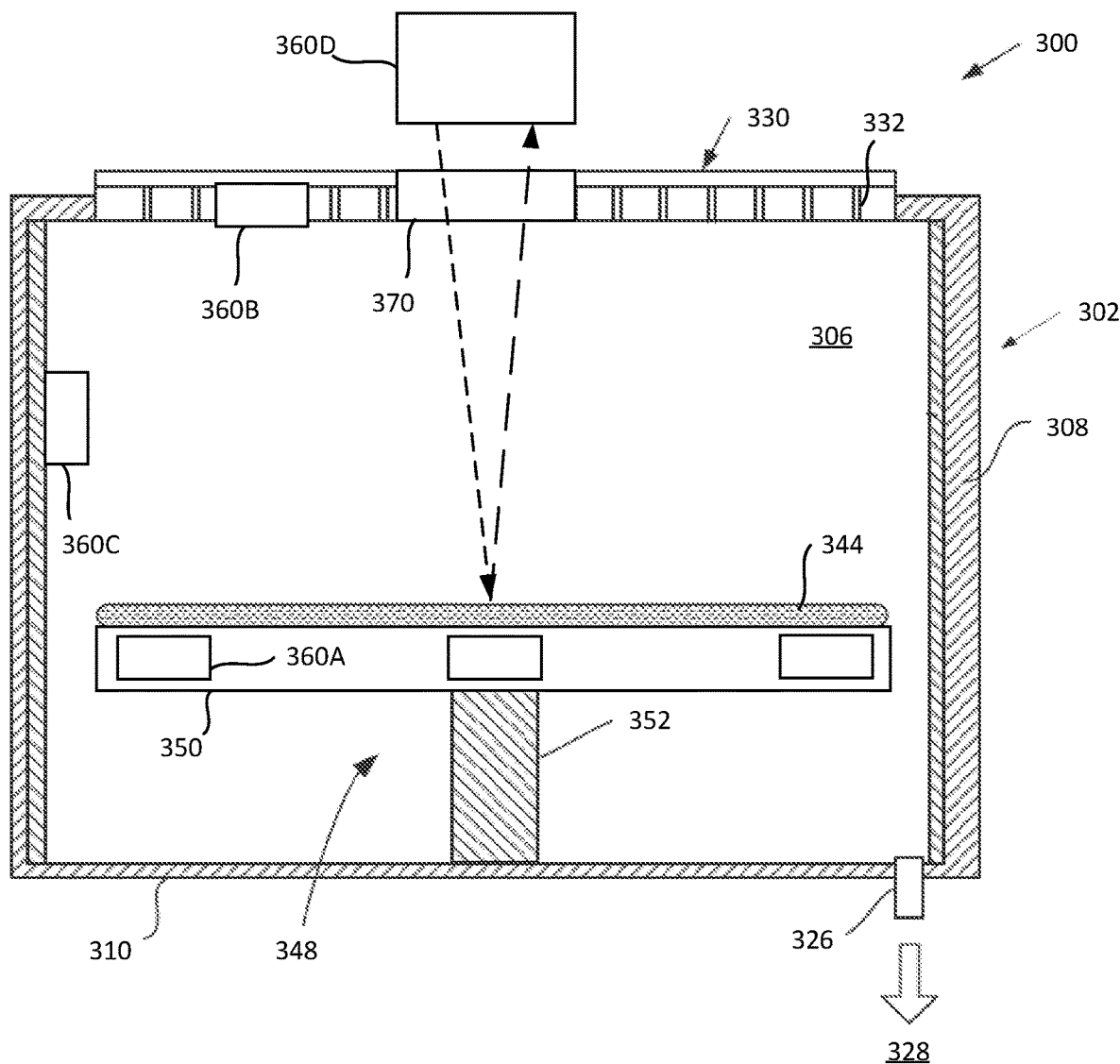
FIG. 3 is a cross-sectional schematic side view of a processing chamber, according to aspects of the present disclosure.

FIG. 3 depicts a cross-sectional schematic side view of a processing chamber 300, according to aspects of the present disclosure. The processing chamber 300 may be used for processes in which a corrosive plasma environment is provided. For example, the processing chamber 300 may be a chamber for a plasma etcher or plasma etch reactor, a plasma cleaner, and so forth. In alternative embodiments other processing chambers may be used, which may or may not be exposed to a corrosive plasma environment. Some examples of chamber components include a chemical vapor deposition (CVD) chamber, a physical vapor deposition (PVD) chamber, an atomic layer deposition (ALD) chamber, an ion assisted deposition (IAD) chamber, an etch chamber, and other types of processing chambers.

In one embodiment, the processing chamber 300 includes a chamber body 302 and a showerhead 330 that encloses an interior volume 306. The chamber body 302 generally includes sidewalls 308 and a bottom 310. The showerhead 330 may include a showerhead base and a showerhead gas distribution plate 332. Alternatively, the showerhead 330 may be replaced by a lid and a nozzle in some embodiments, or by multiple pie shaped showerhead compartments and plasma generation units in other embodiments. An exhaust port 326 may be defined in the chamber body 302, and may couple the interior volume 306 to a pump system 328. The pump system 328 may include one or more pumps and throttle valves utilized to evacuate and regulate the pressure of the interior volume 306 of the processing chamber 300.

The showerhead 330 may be supported on the sidewall 308 of the chamber body 302. The showerhead 330 (or lid) may be opened to allow access to the interior volume 306 of the processing chamber 300, and may provide a seal for the processing chamber 300 while closed. A gas panel (not shown) may be coupled to the processing chamber 300 to provide process and/or cleaning gases to the interior volume 306 through the showerhead 330 or lid and nozzle (e.g., through apertures of the showerhead or lid and nozzle).

A substrate support assembly 348 is disposed in the interior volume 306 of the processing chamber 300 below the showerhead 330. The substrate support assembly 348 holds a substrate, such as substrate 102 of FIG. 1, during processing. In one embodiment, the substrate support assembly 348 includes a pedestal 352 that supports an electrostatic chuck 350. The electrostatic chuck 350 further includes a thermally conductive base and an electrostatic puck bonded to the thermally conductive base. The thermally conductive base and/or electrostatic puck of the electrostatic chuck 350 may include one or more optional embedded heating elements, embedded thermal isolators and/or conduits to control a lateral temperature profile of the substrate support assembly 348. The electrostatic chuck 350 may include at least one clamping electrode controlled by a chucking power source.

Processing chamber 300 may include one or more sensors 360 configured to generate data for a substrate 102 and/or an environment surrounding substrate 102 before, after, or during processing of substrate 102. Each sensor 360 may be configured to transmit data to a controller, such as system controller 128. In some embodiments, one or more sensors 360 may be embedded within a component of processing chamber 300 and may be configured to capture data associated with a function of the component. For example, sensors 360A may be embedded within substrate support assembly 348 and/or electrostatic chuck 350. During operation of processing chamber 300, sensors 360A may generate data associated with a temperature of one or more heating elements embedded within the electrostatic chuck 350, a lateral temperature profile of substrate support assembly 348, an amount of power supplied by the chucking power source, etc. In another example, sensors 360B may be embedded within the gas panel and/or showerhead 330. In such example, sensors 360B may be configured to generate data associated with a composition, flow rate and temperature of process and/or cleaning gases provided to the interior volume 306 through showerhead 330. In other or similar embodiments, one or more sensors 360 may be embedded within the interior volume 306 of processing chamber 300 to capture data associated with the environment surrounding substrate 102 during a process. For example, sensors 360C may be embedded on a surface of the chamber body 302 (e.g., sidewall 308). In such example, sensors 360C may be configured to generate data associated with a pressure of interior volume 306, a temperature of interior volume 306, an amount of radiation within interior volume 306, etc.

In some embodiments, one or more sensors 360 outside of processing chamber 300 may be configured to generate data for substrate 102 and/or the environment surrounding substrate 102 before, after, or during processing of substrate 344. For example, sensor 360D may be configured to generate data associated with one or more portions of a surface of substrate 102. A transparent window 370 may be embedded within at least one of showerhead 330 or sidewalls 308. Sensor 360D may be an optical emission device that includes a light source component and a light reflection component. The light source component may be configured to transmit light through transparent window 370 to a portion of substrate 102. Reflected light may be transmitted from the portion of substrate 102, through transparent window 370, and received by light reflection component of sensor 360D. Sensor 360D may generate spectral data associated with the reflected light received by the light reflection component and may transmit the generated spectral data to a controller, such as system controller 128. In some embodiments sensor 360D may be configured to generate spectral data associated with a center portion of substrate 102, as illustrated. In other or similar embodiments, sensor 360D may be configured to generate spectral data associated with another portion of substrate 102 (e.g., an outer diameter of substrate 102).

Figure 4:
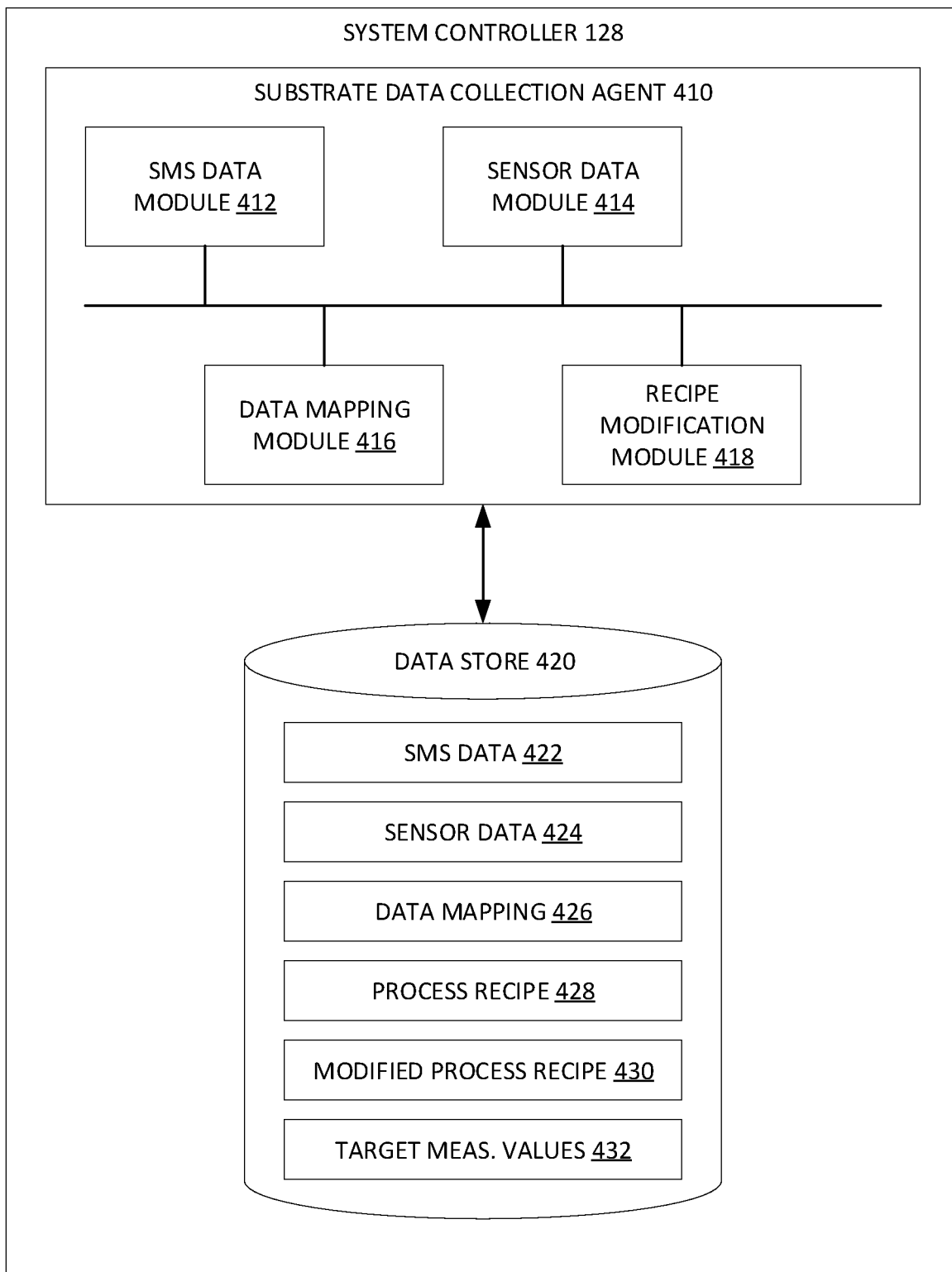
FIG. 4 is a block diagram illustrating a system controller, according to aspects of the present disclosure.

FIG. 4 is a block diagram illustrating a system controller according to aspects of the present disclosure. In some embodiments, the system controller may be system controller 128, described with respect to FIG. 1. System controller 128 may include a substrate data collection agent 410 and a data store 420.

As illustrated, substrate data collection agent 410 may include a substrate measurement subsystem data module 412 (referred to herein as SMS data module 412), a sensor data module 414, a data mapping module 416, and a process recipe modification module 418. Substrate data collection agent 410 may communicate with data store 420 that stores SMS data 422, sensor data 424, data mappings 426, process recipe 428, and modified process recipe 430.

Data store 420 may be configured to store data that is not accessible by a user of the manufacturing system. In some embodiments, all data stored at data store 420 may be inaccessible by a user (e.g., an operator) of the manufacturing system. In other or similar embodiments, a portion of data stored at data store 420 may be inaccessible by the user while another portion of data stored at data store 420 may be accessible by the user. In some embodiments, one or more portions of data stored at data store 420 may be encrypted using an encryption mechanism that is unknown to the user (e.g., data is encrypted using a private encryption key). In other or similar embodiments, data store 420 may include multiple data stores where data that is inaccessible to the user is stored in one or more first data stores and data that is accessible to the user is stored in one or more second data stores.

SMS data module 412 may be configured to receive data from a substrate measurement subsystem, such as substrate measurement subsystem 200 of FIG. 2. As described previously, system controller 128 may generate an instruction to cause a substrate to be transferred to substrate measurement subsystem 200 to obtain one or more measurements for the substrate before or after processing of the substrate at the manufacturing system. Responsive to system controller 128 receiving an indication that the substrate has been transferred to substrate measurement subsystem 200, SMS data module 412 may transmit a request to substrate measurement subsystem 200 to obtain measurements for one or more portions of the substrate.

As described previously, system controller 128 may control a process for a substrate at a manufacturing system in accordance with a process recipe 428. In some embodiments, SMS data module 412 may determine the one or more portions of the substrate to be measured at substrate measurement subsystem 200 based on the process recipe. For example, an operation of the process recipe may include etching a layer of material deposited on a surface of the substrate at a processing chamber. Based on the operation of the process recipe, SMS data module 412 may determine one or more portions of the surface of the substrate to monitor before and after the etch process at the processing chamber. In such embodiments, SMS data module 412 may include an indication of the determined one or more portions of the substrate to be measured at substrate measurement subsystem 200 in the request to obtain measurements at substrate measurement subsystem 200. In such embodiments, a controller at substrate measurement subsystem 200, such as controller 230, may determine the one or more portions of the substrate to measure at substrate measurement subsystem 200, in accordance with embodiments described herein.

Responsive to transmitting a request to obtain measurements, SMS data module 412 may receive SMS data 422 from substrate measurement subsystem 200. SMS data 422 may include spectral data, positional data, property data, and so forth. In some embodiments, SMS data 422 may further include information associated with the substrate (e.g., an identifier for the substrate) or a process associated with the substrate (e.g., a batch number or a process run number). Responsive to receiving SMS data 422 from substrate measurement subsystem 200, SMS data module 412 may cause SMS data 422 to be stored at data store 420.

Sensor data module 414 may be configured to receive data from one or more portions of a manufacturing system, such as processing chamber 300 before, during, or after a process is performed for the substrate. Responsive to the substrate being transferred to processing chamber 300, sensor data module 414 may transmit a request to processing chamber 300 to obtain measurements for one or more portions of the substrate before, during, or after a substrate process is performed at processing chamber 300. In some embodiments, sensor data module 414 may receive data generated by one or more sensors at processing chamber 300 without transmitting a request to obtain measurements at processing chamber 300. In some embodiments, the measurements for the substrate obtained at processing chamber 300 may correspond to the measurements obtained at the substrate measurement subsystem 200. In accordance with embodiments described with respect to SMS data module 412, sensor data module 414 may determine one or more measurements to be obtained at processing chamber 300. For example, sensor data module 414 may determine one or more portions of the substrate to be measured at processing chamber 300.

Sensor data module 414 may receive sensor data 424 from processing chamber 300 in response to transmitting the request for substrate data to processing chamber 300. Sensor data 424 may include spectral data, temperature data, pressure data, and so forth. In some embodiments, sensor data 424 may include information associated with the substrate or a process associated with the substrate (e.g., a substrate identifier or a process identifier), in accordance with previously described embodiments. Responsive to receiving sensor data 424 from processing chamber 300, sensor data module 414 may cause sensor data 424 to be stored at data store 420.

Responsive to system controller 128 receiving SMS data 422 and sensor data 424, data mapping module 416 may generate a mapping between SMS data 422 that is associated with sensor data 424. Data mapping module 416 may determine whether received SMS data 422 for a given substrate is associated with sensor data 424 for the given substrate, and vice versa. In some embodiments, data mapping module 416 may determine SMS data 422 is associated with sensor data 424 based on a common sensor identifier or a common lot identifier. Responsive to determining SMS data 422 for a given substrate is associated with sensor data 424 for the given substrate, data mapping module 416 may generate a mapping between SMS data 422 and sensor data 424 and store the mapping, identified as data mapping 426, in data store 420.

It should be noted that, although embodiments of the present disclosure may describe that the system controller 128 receives SMS data prior to receiving sensor data 424, in some embodiments, system controller 128 can receive sensor data 424 prior to receiving SMS data 422. For example, a first measurement for substrate 102 can be performed at processing chamber 300 and sensor data 424 can be transmitted to system controller 128. Substrate can be transferred to substrate measurement subsystem 200 (e.g., using a transfer robot) after processing at processing chamber 300. Substrate measurement subsystem 200 can perform a second measurement for substrate 102 and transmit SMS data 422 to system controller 128, in accordance with embodiments described above. Further, it should be noted that multiple measurements can be performed at substrate measurement subsystem 200. For example, first SMS data 422 can be obtained during a first measurement at substrate measurement subsystem 200, sensor data 424 can be obtained during a second measurement at processing chamber 300, and second SMS data 422 can be obtained during a third measurement at substrate measurement subsystem 200.

In similar or alternative embodiments, substrate measurement subsystem 200 can perform a first measurement and a second measurement for substrate 102. For example, substrate measurement subsystem 200 can obtain first SMS data 422 (e.g., spectral data) for substrate 102 and can obtain second SMS data 422 (e.g., non-spectral data) for substrate 102. At least one of the first SMS data 422 or second SMS data 422 can be obtained before or after substrate 102 is processed at processing chamber 300.

Recipe modification module 418 may determine whether to modify process recipe 428 based on a data mapping 426 generated by data mapping module 416. Recipe modification module 418 may identify SMS data 422 (e.g., first SMS data, second SMS data, etc.) and/or sensor data 424 mapped together by data mapping 426. In some embodiments, a type of SMS data 422 corresponds to a type of sensor data 424. In such embodiments, recipe modification module 418 may compare SMS data 422 to sensor data 424 to determine a difference between SMS data 422 and sensor data 424. Responsive to determining a difference between SMS data 422 and sensor data 424, recipe modification module 418 may compare the determined difference to a difference threshold. Responsive to determining the difference exceeds the difference threshold, recipe modification module 418 may determine to modify the process recipe 428.

In some embodiments, recipe modification module 418 may determine a position of the substrate within the processing chamber 300 based on a mapping between SMS data 422 and sensor data 424. As described previously, SMS data 422 can include spectral data generated for one or more portions of the substrate at substrate measurement subsystem 200. SMS data 422 can further include positional data associated with the generated spectral data (e.g., Cartesian coordinates for each portion of the substrate). Also described previously, sensor data 424 can include spectral data generated at one or more portions of the substrate at processing chamber 300. Recipe modification module 418 may identify first spectral data of SMS data 422 that corresponds to second spectral data of sensor data 424. Recipe modification module 418 can determine a position of the substrate within processing chamber 300 based on positional data of SMS data 422 that is associated with the first spectral data of SMS data 422. Recipe modification module can whether to modify the process recipe for the substrate within processing chamber 300 based on the determined position of the substrate within processing chamber 300.

In some embodiments, recipe modification module 418 may compare SMS data 422 to target measurement value 432. Target measurement value 432 may include target measurement values for one or more portions of the substrate. Responsive to determining a difference between SMS data 422 and target measurement value 432 exceeds a difference threshold, recipe modification module 418 may determine to modify the process recipe 428.

In some embodiments, recipe modification module 418 may determine a modification to the process recipe 428 that is expected to account for a difference between SMS data 422 and sensor data 424 and/or SMS data 422 and target measurement value 432. In some embodiments, recipe modification module 418 may determine a modification to the process recipe 428 by providing the difference between the SMS data 422 and sensor data 424 and/or SMS data 422 and target measurement value 432 to a modification determination component (not shown). In such embodiments, the modification determination component may provide, to recipe modification module 418, a recommended modification to be made to the process recipe 428 based on the provided difference. In some embodiments, the modification determination component may be a rule database that includes one or more rules associated with process recipe modifications that can be made in view of differences between difference between SMS data 422 and sensor data 424 and/or SMS data 422 and target measurement value 432. In other or similar embodiments, modification determination component can include a data structure that associates a difference between SMS data 422 and sensor data 424 and/or SMS data 422 and target measurement value 432 to a process recipe modification.

In an illustrative example, modification determination component can determine, based on a difference a difference between SMS data 422 and sensor data 424 and/or SMS data 422 and target measurement value 432, that a processing chamber used to process the substrate is associated with a non-uniform etch rate. Based on the determination that the processing chamber is associated with a non-uniform etch rate, modification determination component can identify one or more process parameter values to modify in order to achieve a uniform etch rate for future substrates processed at the processing chamber. An example of a process parameter value modification can include a decrease of a temperature at a first zone of a substrate support assembly and an increase of a temperature of a first zone of the substrate support assembly.

In some embodiments, recipe modification module 418 may transmit a notification to a client device connected to the manufacturing system, where the notification indicates a modification to the process recipe 428 is recommended. The client device may display the notification to a user of the client device via a GUI, such as GUI 500 of FIG. 5. Recipe modification module 418 may receive, from the client device, an instruction to modify the process recipe 428. Responsive to receiving the instruction to modify the process recipe 428, recipe modification module 418 may modify the process recipe and store the modified process recipe 430 at data store 420. In some embodiments, recipe modification module 418 may not transmit a notification to the client device and instead may modify the process recipe.

As described above, a first measurement for substrate 102 can be performed at processing chamber 300 and a second measurement for substrate 102 can be performed at substrate measurement subsystem 200. In such embodiments, substrate measurement subsystem 200 can determine a position of the substrate 102 at the substrate measurement subsystem 200, in accordance with previously described embodiments. Recipe modification module 418 can determine the position of the substrate within the processing chamber 300 based on the mapping between SMS data 422 (i.e., the second measurement) and the sensor data 424 (i.e., the first measurement). Recipe modification module 418 can compare the SMS data 422 to the sensor data 424 and determine, based on the comparison, whether to modify the process recipe 428, in accordance with previously described embodiments.

In some embodiments, external metrology data can be collected for substrate 102 at an external metrology tool (e.g., before and/or after the substrate 102 is processed at processing chamber 300). System controller 128 can receive the external metrology data from the external metrology tool and can store the received external metrology data at the data store, in accordance with previously described embodiments. Data mapping module 416 can update the data mapping for substrate 102 to include a mapping between the external metrology data and other data (e.g., SMS data 422, sensor data 424) for substrate 102. Recipe modification module 418 can determine whether to modify process recipe 428 based on the updated data mapping 426 for substrate 102, in accordance with previously described embodiments.

Figure 5:
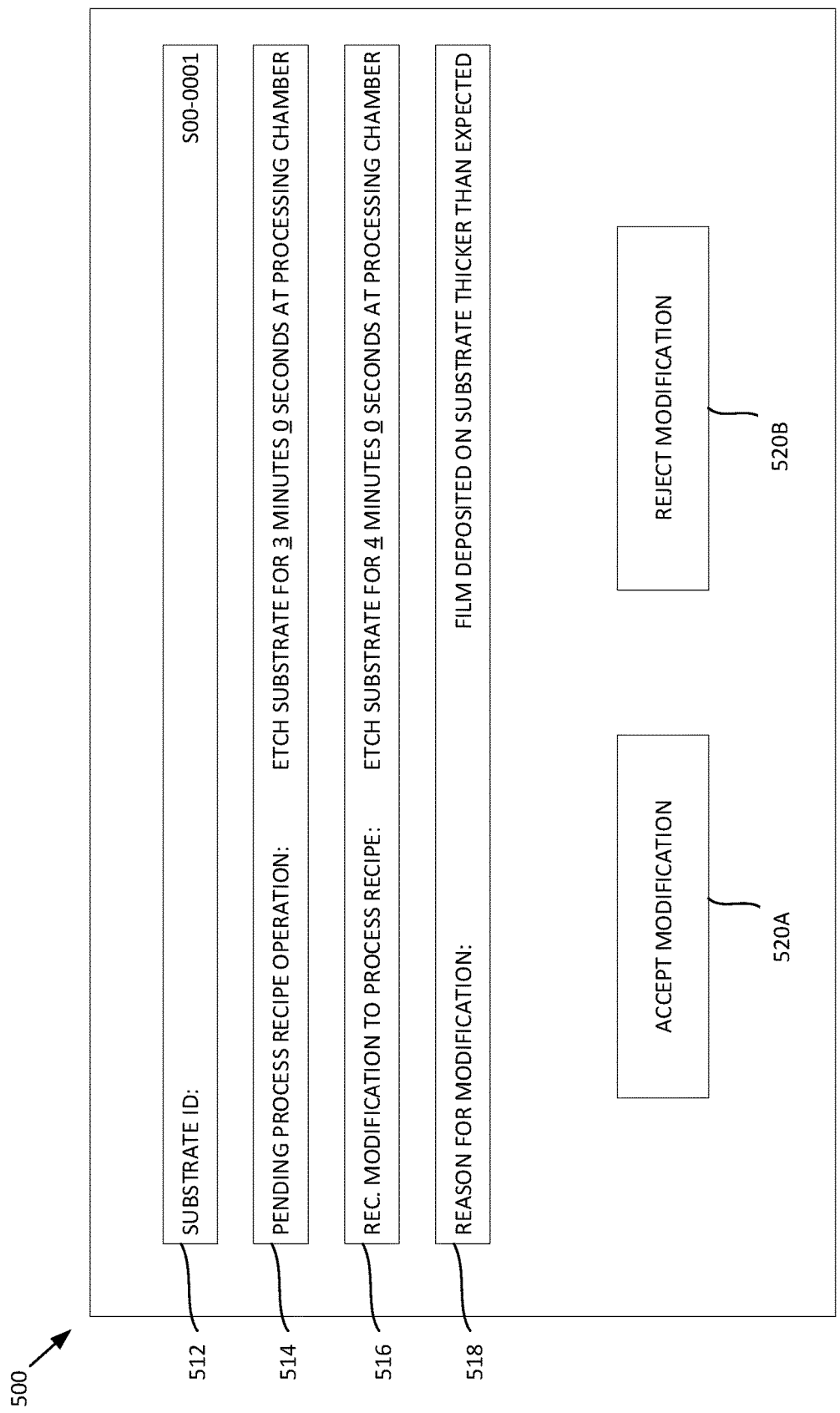
FIG. 5 illustrates an example graphical user interface for providing notifications to an operator of a manufacturing system, according to aspects of the present disclosure.

FIG. 5 illustrates an example graphical user interface (GUI) 500 for providing notifications to a user (e.g., an operator) of a manufacturing system, according to aspects of the present disclosure. In some embodiments, GUI 500 may be presented to the user via a client device connected to the manufacturing system.

GUI 500 may include one or more GUI elements to provide or receive information from a user of the client device. GUI 500 may include a substrate ID element 512 that provides an identifier of a substrate being processed at the manufacturing system. For example, substrate ID element 512 may provide an indication that substrate "S00-0001" is being processed at the manufacturing system. GUI 500 may further include a pending process recipe operation element 514 that provides an indication of an operation of a process recipe that is to be performed for the substrate at a portion of the manufacturing system. As illustrated in FIG. 5, element 514 may provide an indication that an etch operation is to be performed for substrate. In some embodiments, element 514 may details regarding the operation to be performed for the substrate. For example, element 514 may provide an indication that the etch operation for the substrate is to be performed at a processing chamber and the etch operation is to be performed for 3 minutes and 0 seconds.

GUI 500 may further include a recommended process recipe element 516 that provides an indication of a recommended modification to one or more operations of the process recipe. As illustrated in FIG. 5, element 516 may provide a recommended modification for an etch process for the substrate. The recommended modification may include etching the substrate for 4 minutes and 0 seconds instead of etching the substrate for 3 minutes and 0 seconds, as included in the original process recipe. In some embodiments, GUI 500 may also include a reason for modification element 518 which provides a reason that a modification to one or more operations of the process recipe is recommended. As illustrated in FIG. 5, element 518 may indicate that the recommended modification to the process recipe is provided based on a determination that a film deposited on the substrate is thicker than expected.

GUI 500 may further include one or more interactive elements that enable a user of the client device to accept or reject a modification to the recipe. As illustrated in FIG. 5, a user may select an accept modification element 520A to accept the recommended modification to the process recipe indicated by element 516. Responsive to receiving an indication that a user has selected the accept modification element 520A, the client device may generate and transmit a notification to the system controller including an instruction to modify the process recipe in accordance with the recommended modification. A user may also select a reject modification element 520B to reject the recommended modification to the process recipe. Responsive to receiving an indication that a user has selected the reject modification element 520B, the client device may generate and transmit a notification to the system controller including an instruction to not modify the process recipe in accordance with the recommended modification.

Figure 6:
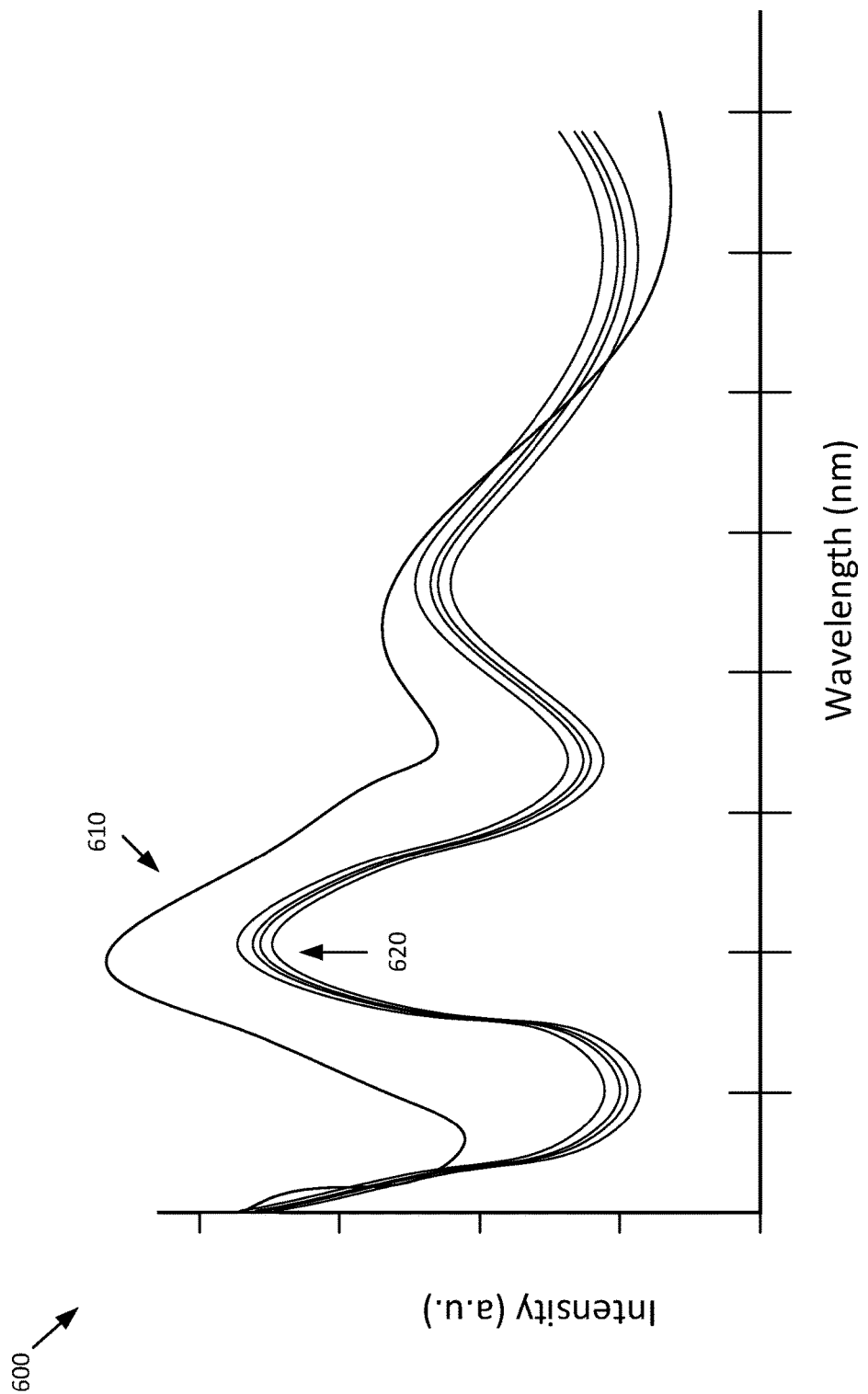
FIG. 6 illustrates spectral data collected for a substrate, according to aspects of the present disclosure.

FIG. 6 illustrates example spectral data 600 generated from reflected energy received by the substrate measurement subsystem 200 of FIG. 2 or sensor 360D of FIG. 3, according to aspects of the present disclosure. As illustrated, multiple wave lengths may be included in reflected energy waves received by substrate measurement subsystem 200. Each reflected energy wave may be associated with a different portion of substrate 102. In some embodiments, an intensity may be measured for each reflected energy wave received by substrate measurement subsystem 200. As seen in FIG. 6, each intensity can be measured for each wavelength of reflected energy waves received by substrate measurement subsystem 200. The association between each intensity and each wavelength can be the basis for the formation of spectral data 600. In some embodiments, one or more wavelengths can be associated with an intensity value that is outside of an expected range of intensity values. For example, line 610 can be associated with an intensity value that is outside of the expected range of intensity values, as illustrated by lines 620. In such embodiments, the intensity value that is outside of the expected range of intensity values can be an indication that a defect exists at a portion of substrate 102. A modification may be made to a process recipe for substrate 102 based on the indication of the defect at the portion of substrate 102, in accordance with previously described embodiments.

FIGS. 7-10 are flow diagrams of various embodiments of methods 700-1000 for determining whether to modify a process recipe for a substrate. The methods 700-1000 are performed by processing logic that may include hardware (circuitry, dedicated logic, etc.), software (such as is run on a general purpose computer system or a dedicated machine), firmware, or some combination thereof. Some methods 700-800 may be performed by a computing device, such as system controller 128 of FIG. 1. Some methods 900-1000 may be performed by a computing device, such as controller 230 of FIG. 2.

For simplicity of explanation, the methods are depicted and described as a series of acts. However, acts in accordance with this disclosure may occur in various orders and/or concurrently, and with other acts not presented and described herein. Furthermore, not all illustrated acts may be performed to implement the methods in accordance with the disclosed subject matter. In addition, those skilled in the art will understand and appreciate that the methods could alternatively be represented as a series of interrelated states via a state diagram or events.

Figure 7:
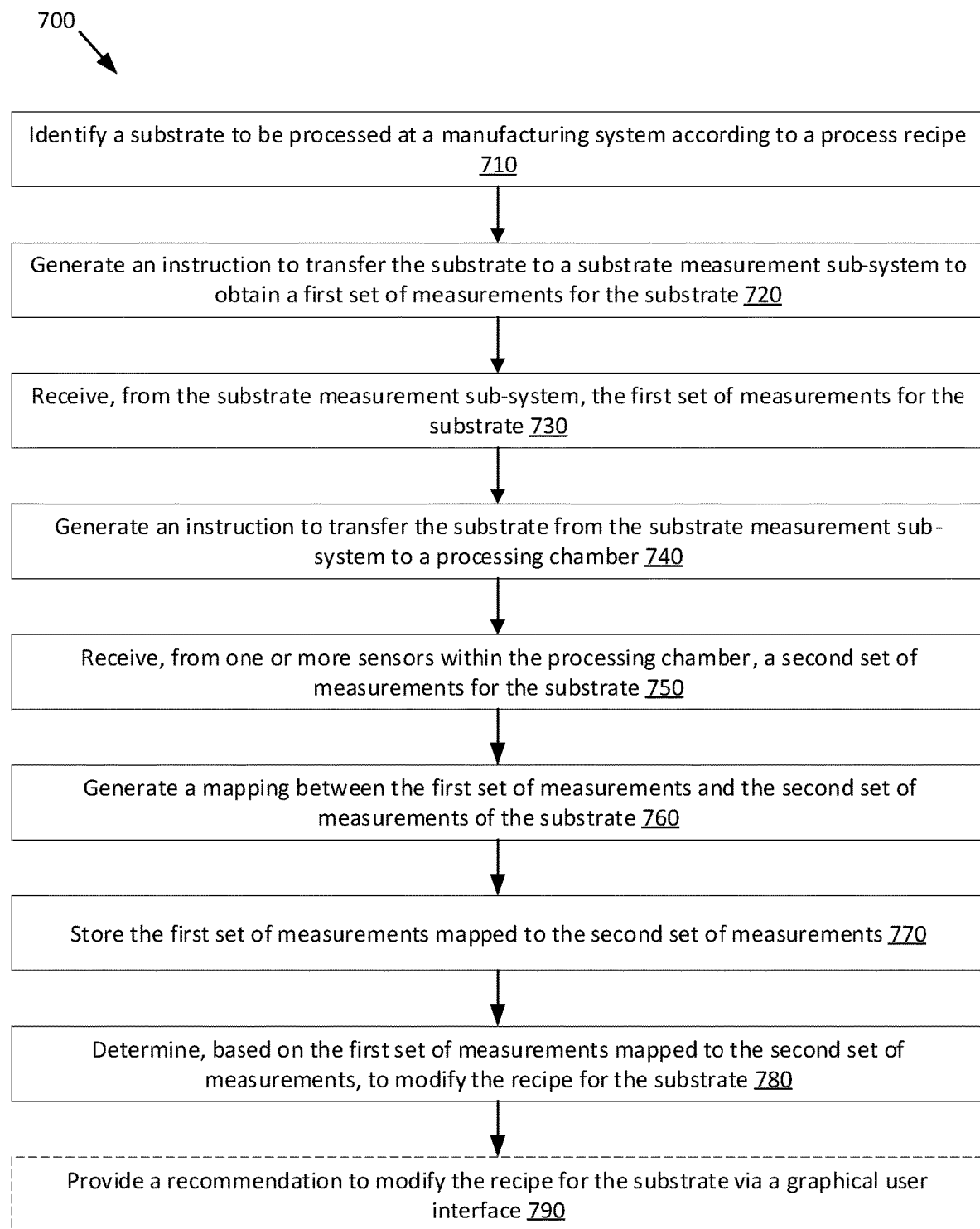
FIG. 7 is a flow chart of a method for determining whether to modify a process recipe for a wafer, according to aspects of the present disclosure.

FIG. 7 is a flow chart of a method 700 for determining whether to modify a process recipe for a substrate, according to aspects of the present disclosure. At block 710, processing logic identifies a substrate to be processed at a manufacturing system according to a process recipe. At block 720, processing logic generates an instruction to transfer the substrate to a substrate measurement subsystem to obtain a first set of measurements for the substrate. In some embodiments, the first set of measurements can include spectral or non-spectral data (e.g., eddy current data, capacitance data, etc.) for the substrate. At block 730, processing logic receives, from the substrate measurement subsystem, the first set of measurements for the substrate. At block 740, processing logic generates an instruction to transfer the substrate from the substrate measurement subsystem to a processing chamber of the manufacturing system. At block 750, processing logic receives, from one or more sensors within the processing chamber, a second set of measurements for the substrate. In some embodiments, the second set of measurements for the substrate can include spectral or non-spectral data (e.g., power data, temperature data, pressure data, etc.) for the substrate. At block 760, processing logic generates a mapping between the first set of measurements and the second set of measurements of the substrate. At block 770, processing logic stores the first set of measurements mapped to the second set of measurements. At block 780, processing logic determines, based on the first set of measurements mapped to the second set of measurements, to modify the process recipe for the substrate. At block 790, processing logic optionally provides a recommendation to modify the recipe for the substrate via a graphical user interface.

As described above, in some embodiments, the processing logic can generate the instruction to transfer the substrate form the substrate measurement system to the processing chamber of the manufacturing system and receive the second set of measurements for the substrate prior to generating the instruction to transfer the substrate to the substrate measurement sub-system to obtain the first set of measurements for the substrate and receiving, from the substrate measurement subsystem, the first set of measurements for the substrate.

Figure 8:
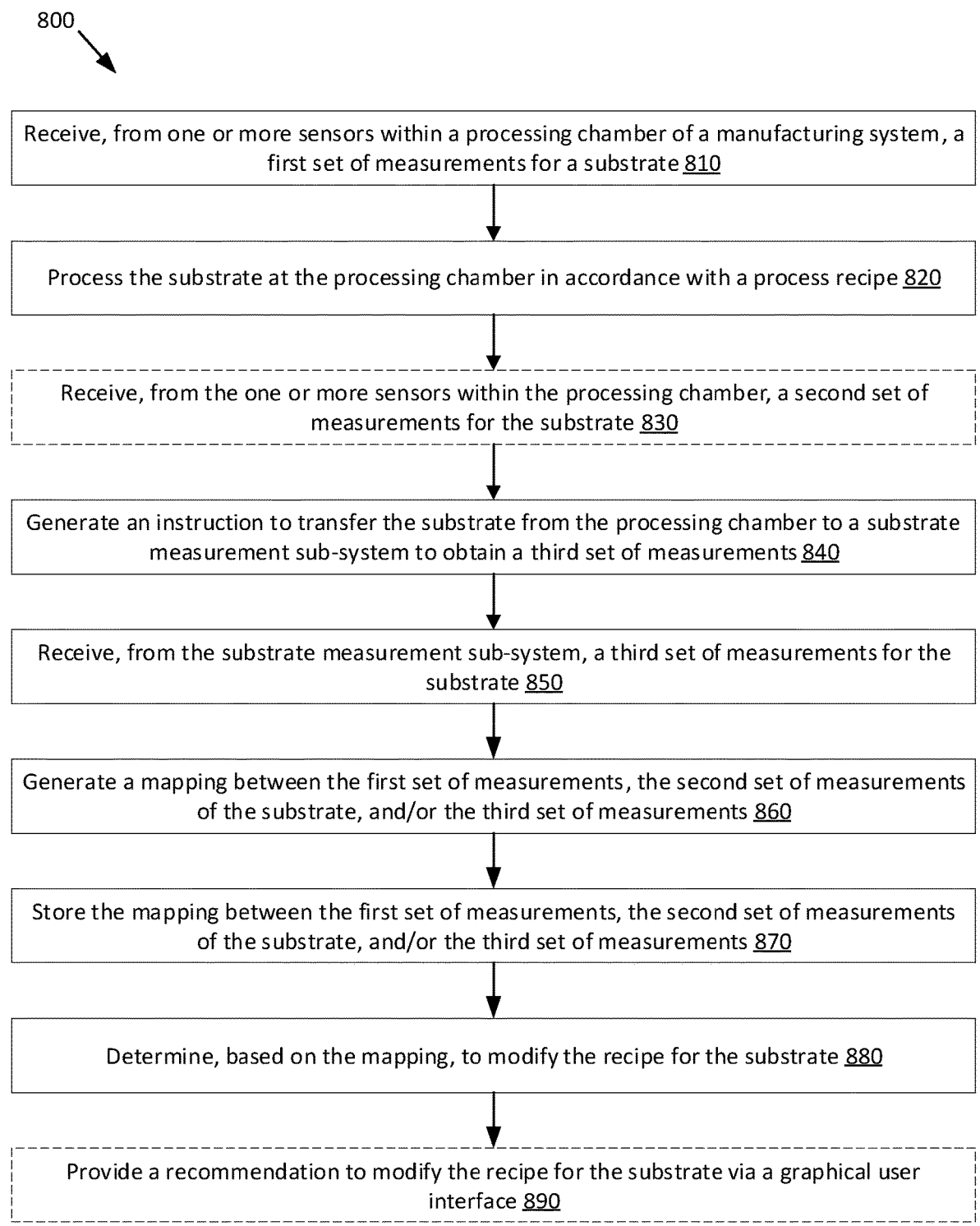
FIG. 8 is a flow chart of another method for determining whether to modify a process recipe for a wafer, according to aspects of the present disclosure.

FIG. 8 is a flow chart of another method 800 for determining whether to modify a process recipe for a substrate, according to aspects of the present disclosure. At block 810, processing logic receives, from one or more sensors within a processing chamber of a manufacturing system, a first set of measurements for a substrate. At block 820, processing logic processes the substrate at the processing chamber in accordance with a process recipe. At block 830, processing logic optionally receives, from the one or more sensors within the processing chamber, a second set of measurements for the substrate. At block 840, processing logic generates an instruction to transfer the substrate from the processing chamber to a substrate measurement subsystem to obtain a third set of measurements. At block 850, processing logic receives, form the substrate measurement subsystem, a third set of measurements for the substrate. At block 860, processing logic generates a mapping between the first set of measurements, the second set of measurements, and/or the third set of measurements. At block 870, processing logic stores the mapping between the first set of measurements, the second set of measurements, and/or the third set of measurements. At block 880, processing logic determines, based on the mapping between the first set of measurements, the second set of measurements, and/or the third set of measurements, to modify the recipe for the substrate. At block 890, processing logic optionally provides a recommendation to modify the recipe for the substrate via a graphical user interface.

FIG. 9 is a flow chart of a method 900 for obtaining data for a substrate at a substrate measurement subsystem, according to aspects of the present disclosure. At block 910, processing logic receives an indication that a substrate being processed at a manufacturing system has been loaded into a substrate measurement subsystem. At block 920, processing logic determines positional data of the substrate within the substrate measurement subsystem. At block 930, processing logic receives a recipe for the substrate. At block 940, processing logic determines, based on the positional data and the recipe of the substrate, one or more portions of the substrate to be measured by one or more sensing components of the substrate measurement subsystem. At block 950, processing logic obtains measurements for each of the determined portions of the substrate by the one or more sensing components (e.g., spectral sensing components, non-spectral sensing components, etc.) of the substrate measurement subsystem. At block 960, processing logic transmits the obtained measurements of each of the determined portions of the substrate to a system controller.

Figure 10:
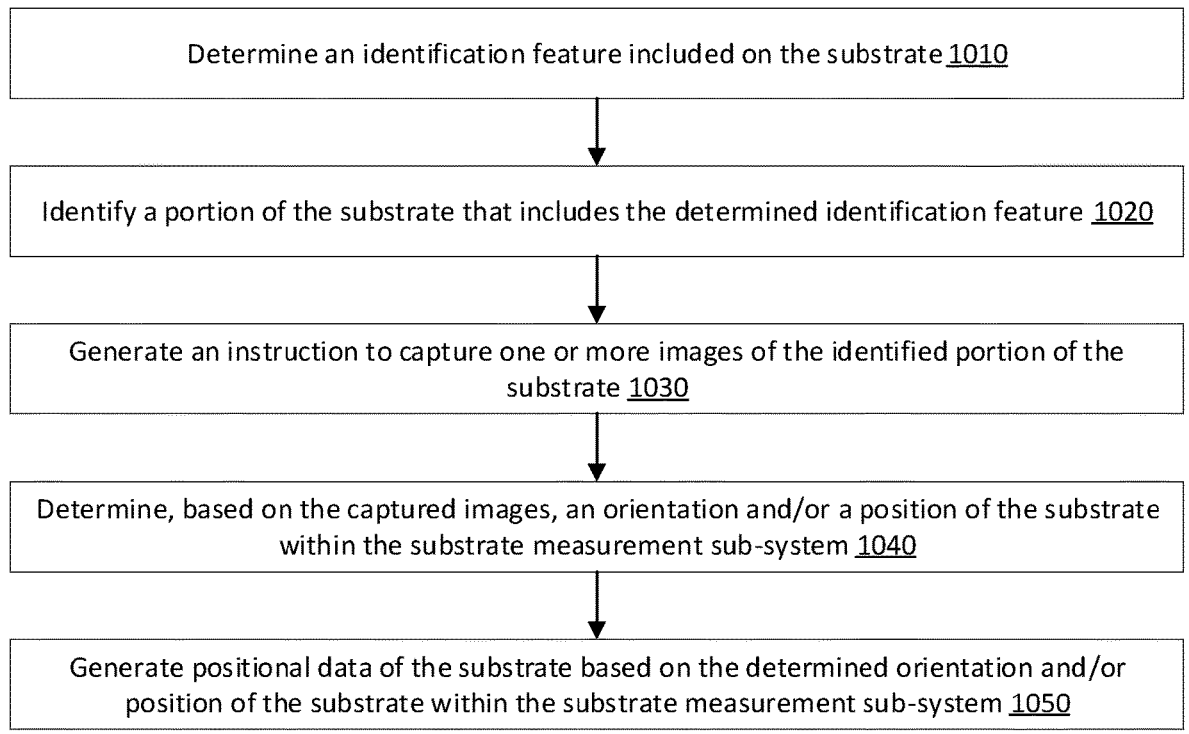
FIG. 10 is a flow chart of a method for determining positional data for a substrate within a substrate measurement subsystem, according to aspects of the present disclosure.

FIG. 10 is a flow chart of a method 1000 for determining positional data for a substrate within a substrate measurement subsystem, according to aspects of the present disclosure. At block 1010, processing logic determines an identification feature included on the substrate. In some embodiments, the identification feature can correspond to a reference location of the substrate (e.g., a center of the substrate). At block 1020, processing logic identifies a portion of the substrate that includes the determined identification feature. At block 1030, processing logic generates an instruction to capture one or more images of the identified portion of the substrate. At block 1040, processing logic determines, based on the captured one or more images, an orientation and/or a position of the substrate within the substrate measurement subsystem. At block 1050, processing logic generates positional data of the substrate based on the determined orientation and/or position of the substrate within the substrate measurement subsystem.

Figure 11:
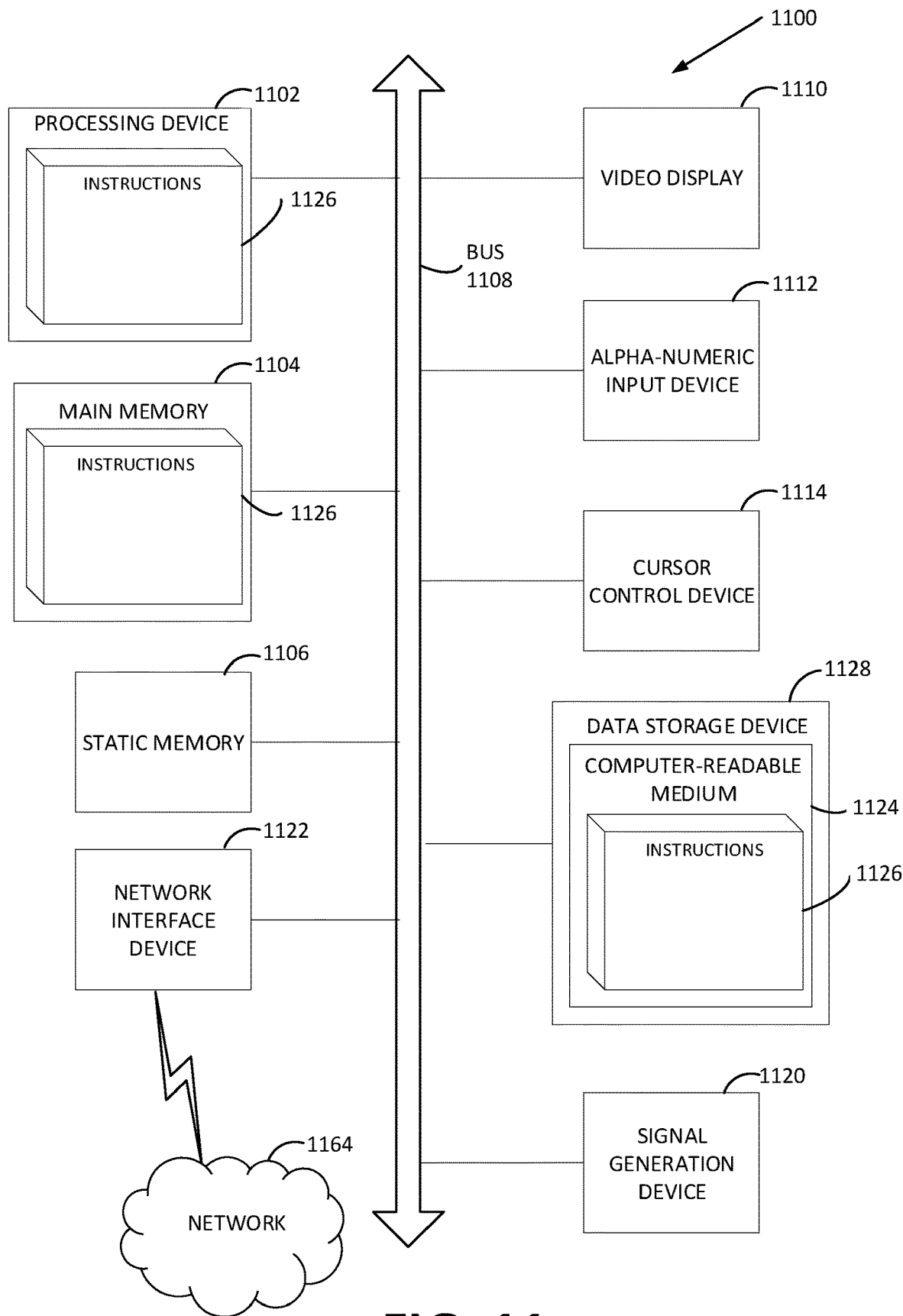
FIG. 11 illustrates a diagrammatic representation of a machine in the example form of a computing device within which a set of instructions, for causing the machine to perform any one or more of the methodologies discussed herein, can be executed

FIG. 11 illustrates a diagrammatic representation of a machine in the example form of a computing device 1100 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 1100 may correspond to system controller 128 of FIG. 1 or controller 320 of FIG. 3.

The example computing device 1100 includes a processing device 1102, a main memory 1104 (e.g., read-only memory (ROM), flash memory, dynamic random access memory (DRAM) such as synchronous DRAM (SDRAM), etc.), a static memory 1106 (e.g., flash memory, static random access memory (SRAM), etc.), and a secondary memory (e.g., a data storage device 1128), which communicate with each other via a bus 1108.

Processing device 1102 may represent one or more general-purpose processors such as a microprocessor, central processing unit, or the like. More particularly, the processing device 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. Processing device 1102 may also be or include a system on a chip (SoC), programmable logic controller (PLC), or other type of processing device. Processing device 1102 is configured to execute the processing logic for performing operations and steps discussed herein.

The computing device 1100 may further include a network interface device 1122 for communicating with a network 1164. The computing device 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), and a signal generation device 1120 (e.g., a speaker).

The data storage device 1128 may include a machine-readable storage medium (or more specifically a non-transitory computer-readable storage medium) 1124 on which is stored one or more sets of instructions 1126 embodying any one or more of the methodologies or functions described herein. Wherein a non-transitory storage medium refers to a storage medium other than a carrier wave. The instructions 1126 may also reside, completely or at least partially, within the main memory 1104 and/or within the processing device 1102 during execution thereof by the computer device 1100, the main memory 1104 and the processing device 1102 also constituting computer-readable storage media.

While the computer-readable storage medium 1124 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
receiving an indication that a substrate being processed at a manufacturing system has been loaded into a substrate measurement subsystem, the substrate measurement subsystem comprising a first removable sensing component;
determining to replace the first removable sensing component with a second removable sensing component, wherein the first removable sensing component is subsequently replaced with the second removable sensing component;
obtaining first positional data of the substrate within the substrate measurement subsystem, the obtained first positional data indicating a position and an orientation of the substrate within the substrate measurement subsystem;
determining, based on the first positional data of the substrate and a process recipe for the substrate, one or more portions of the substrate to be measured by the second removable sensing component of the substrate measurement subsystem;
obtaining measurements of each of the determined one or more portions of the substrate by the second removable sensing component of the substrate measurement subsystem; and
transmitting the obtained measurements of each of the determined one or more portions of the substrate to a system controller.

2. The method of claim 1, wherein the first removable sensing component of the substrate measurement subsystem comprises a first spectra sensing component configured to generate first spectral data for each of the determined one or more portions of the substrate, and wherein the second removable sensing component of the substrate measurement subsystem comprises a second spectra sensing component configured to generate second spectral data for each of the determined one or more portions of the substrate.

3. The method of claim 2, wherein the first spectral data and the second spectral data each comprises at least one of: reflectometry spectral data, ellipsometry spectral data, hyperspectral imaging data, or chemical imaging data.

4. The method of claim 2, wherein the first spectra sensing component of the first removable sensing component comprises a first type of spectra sensing component configured to generate a first type of spectral data and wherein the second spectra sensing component of the second removable sensing component comprises a second type of spectra sensing component configured to generate a second type of spectral data, and wherein the method further comprises:
receiving an indication of one or more types of measurements to be obtained for each of the determined one or more portions of the substrate by the one or more sensing components of the substrate measurement subsystem; and
determining, based on the indication of the one or more types of measurements to be obtained for each of the determined one or more portions of the substrate, the first type of spectral data, and the second type of spectral data, whether to obtain measurements for each of the determined one or more portions of the substrate using the first type of spectra sensing component or the second type of spectra sensing component.

5. The method of claim 2, wherein the first spectra sensing component of the first removable sensing component is configured to generate a first type of spectral data, and wherein the second spectra sensing component of the second removable sensing component is configured to generate a second type of spectra data, the method further comprising:
receiving an indication of one or more types of measurements to be obtained for each of the determined one or more portions of the substrate by the substrate measurement subsystem;
determining, based on the indication of the one or more types of measurements to be obtained for each of the determined one or more portions of the substrate and the first type of spectral data, that the second spectra sensing component of the second removable sensing component is an optimal sensing component for obtaining the one or more types of measurements for each of the determined one or more portions of the substrate; and
transmitting, based on the determination that the second type of spectra sensing component is the optimal sensing component for obtaining the one or more types of measurements, a notification to the system controller, the notification indicating that the first removable sensing component of the substrate measurement subsystem should be replaced with the second removable sensing component and the second removable sensing component should be used to obtain the one or more types of measurements for each of the determined one or more portions of the substrate.

6. The method of claim 1, wherein determining positional data of the substrate within the substrate measurement subsystem comprises:
determining an identification feature included on the substrate that indicates a location of a portion of the substrate relative to a reference location of the substrate;
generating an instruction to generate one or more images of the substrate, wherein a generated image includes a depiction of the identification feature included on the substrate;
determining, based on the depiction of the identification feature included in the generated image, the orientation and the position of the substrate included in the substrate measurement subsystem; and
generating, based on the determined orientation and the determined position of the substrate, the first positional data of the substrate, wherein the first positional data comprises a first coordinate for the identification feature relative to the reference location of the substrate.

7. The method of claim 6, further comprising:
determining second positional data corresponding to a determined portion of the substrate to be measured by the second removable sensing component, wherein the second positional data comprises a second coordinate for the corresponding determined portion of the substrate relative to the first coordinate for the identification feature;
responsive to obtaining measurements for the determined portions of the substrate, generating a mapping between the obtained measurement for the determined portion of the substrate and the corresponding second positional data; and
transmitting the mapping between the obtained measurement for the determined portion and the corresponding second positional data to the system controller.

8. The method of claim 1, further comprising:
transmitting, with the obtained measurement of each of the determined one or more portions of the substrate, the obtained first positional data to the system controller.

9. The method of claim 6, further comprising:
determining a type associated with the substrate,
wherein the identification feature included on the substrate is determined in view of the determined type associated with the substrate.

10. The method of claim 1, wherein the process recipe for the substrate is associated with at least one of a process that was previously performed for the substrate or a process that is to be performed for the substrate.

11. A substrate measurement subsystem, comprising:
a first removable sensing component and a second removable sensing component, the first removable sensing component and the second removable sensing component configured to obtain measurements for one or more portions of a substrate within the substrate measurement subsystem; and
a controller coupled to the first removable sensing component, wherein the controller is to:
receive an indication that a substrate being processed at a manufacturing system has been loaded into the substrate measurement subsystem;
determine that the first removable sensing component is to be replaced with the second removable sensing component, wherein the first removable sensing component is subsequently replaced with the second removable sensing component;
obtain first positional data of the substrate within the substrate measurement subsystem, the obtained first positional data indicating a position and an orientation of the substrate within the substrate measurement subsystem;
determine, based on the first positional data of the substrate and a process recipe for the substrate, one or more portions of the substrate to be measured by the second sensing component of the substrate measurement subsystem;
obtain measurements of each of the determined one or more portions of the substrate by the second removable sensing component of the substrate measurement subsystem; and transmit the obtained measurements of each of the determined one or more portions of the substrate to a system controller.

12. The substrate measurement subsystem of claim 11, wherein the first removable sensing component of the substrate measurement subsystem comprises a first spectra sensing component configured to generate first spectral data for each of the determined one or more portions of the substrate, and wherein the second removable sensing component of the substrate measurement subsystem comprises a second spectra sensing component configured to generate second spectral data for each of the determined one or more portions of the substrate.

13. The substrate measurement subsystem of claim 12, wherein the first spectral data and the second spectral data each comprises at least one of: reflectometry spectral data, ellipsometry spectral data, hyperspectral imaging data, or chemical imaging data.

14. The substrate measurement subsystem of claim 12, wherein the first spectra sensing component of the first removable sensing component is configured to generate a first type of spectral data and the second spectra sensing component of the second removable sensing component is configured to generate a second type of spectral data, and wherein the controller is further to:
receive an indication of one or more types of measurements to be obtained for each of the determined one or more portions of the substrate by the substrate measurement subsystem; and
determine, based on the indication of the one or more types of measurements to be obtained for each of the determined portions of the substrate, the first type of spectral data, and the second type of spectral data, whether to obtain measurements for each of the determined portions of the substrate using the first removable sensing component or the second removable sensing component.

15. The substrate measurement subsystem of claim 12, wherein the first spectra sensing component of the first removable sensing component is configured to generate a first type of spectral data, wherein the second spectra sensing component of the second removable sensing component is configured to generate a second type of spectral data, and wherein the controller is further to:
receive an indication of one or more types of measurements to be obtained for each of the determined one or more portions of the substrate by the one or more sensing components of the substrate measurement subsystem;
determine, based on the indication of the one or more types of measurements to be obtained for each of the determined one or more portions of the substrate and the first type of spectral data, that the second spectra sensing component of the second removable sensing component is an optimal sensing component for obtaining the one or more types of measurements for each of the determined one or more portions of the substrate; and
transmit, based on the determination that the second spectra sensing component of the second removable sensing component is the optimal sensing component for obtaining the one or more types of measurements, a notification to the system controller, the notification indicating that the first removable sensing component of the substrate measurement subsystem should be replaced with the second removable sensing component and the second removable sensing component should be used to obtain the one or more types of measurements for each of the determined one or more portions of the substrate.

16. The substrate measurement subsystem of claim 11, further comprising:
one or more position determination components configured to determine a position of the substrate within the substrate measurement subsystem.

17. The substrate measurement subsystem of claim 16, wherein to determine positional data of the substrate within the substrate measurement subsystem, the controller is to:
determine an identification feature included on the substrate that indicates a location of a portion of the substrate relative to a reference location of the substrate;
generate an instruction to cause the one or more position determination components to generate one or more images of the substrate, wherein a generated image includes a depiction of the identification feature included on the substrate;
determine, based on the depiction of the identification feature included in the generated image, the orientation and the position of the substrate included in the substrate measurement subsystem; and
generate, based on the determined orientation and the determined position of the substrate, the first positional data of the substrate, wherein the first positional data comprises a first coordinate for the identification feature relative to the reference location of the substrate.

18. A non-transitory computer readable storage medium comprising instructions that, when executed by a processing device, cause the processing device to:
receive an indication that a substrate being processed at a manufacturing system has been loaded into a substrate measurement subsystem;
determine that a first removable sensing component of the substrate measurement subsystem is to be replaced with a second removable sensing component of the substrate measurement subsystem, wherein the first removable sensing component is subsequently replaced with the second removable sensing component;
obtain first positional data of the substrate within the substrate measurement subsystem, the obtained first positional data indicating a position and an orientation of the substrate within the substrate measurement subsystem;
determine, based on the first positional data of the substrate and a process recipe for the substrate, one or more portions of the substrate to be measured by the second removable sensing component of the substrate measurement subsystem;
obtain measurements of each of the determined one or more portions of the substrate by the second removable sensing component of the substrate measurement subsystem; and
transmit the obtained measurements of each of the determined one or more portions of the substrate to a system controller.

19. The non-transitory computer readable storage medium of claim 18, wherein the first removable sensing component of the substrate measurement subsystem comprises a first spectra sensing component configured to generate first spectral data for each of the determined one or more portions of the substrate, and wherein the second removable sensing component of the substrate measurement subsystem comprises a second spectra sensing component configured to generate second spectral data for each of the determined one or more portions of the substrate.

20. The non-transitory computer readable storage medium of claim 19, wherein the first spectral data and the second spectral data each comprises at least one of: reflectometry spectral data, ellipsometry spectral data, hyperspectral imaging data, or chemical imaging data.

* * * * *